(12) United States Patent
Shimomura et al.

(10) Patent No.: US 10,529,805 B2
(45) Date of Patent: Jan. 7, 2020

(54) SEMICONDUCTOR DEVICE

(71) Applicant: KABUSHIKI KAISHA TOSHIBA, Minato-ku, Tokyo (JP)

(72) Inventors: Saya Shimomura, Ishikawa (JP); Hiroaki Katou, Ishikawa (JP); Kenya Kobayashi, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/446,499

(22) Filed: Mar. 1, 2017

(65) Prior Publication Data
US 2018/0076307 A1 Mar. 15, 2018

(30) Foreign Application Priority Data
Sep. 15, 2016 (JP) .................... 2016-180766

(51) Int. Cl.
| | | |
|---|---|---|
| *H01L 29/10* | (2006.01) | |
| *H01L 27/06* | (2006.01) | |
| *H01L 29/78* | (2006.01) | |
| *H01L 29/40* | (2006.01) | |
| *H01L 29/06* | (2006.01) | |
| *H01L 29/861* | (2006.01) | |
| *H01L 29/423* | (2006.01) | |

(52) U.S. Cl.
CPC ...... *H01L 29/1004* (2013.01); *H01L 27/0623* (2013.01); *H01L 29/0649* (2013.01); *H01L 29/0696* (2013.01); *H01L 29/407* (2013.01); *H01L 29/7805* (2013.01); *H01L 29/7813* (2013.01); *H01L 29/42372* (2013.01); *H01L 29/8611* (2013.01)

(58) Field of Classification Search
CPC ............ H01L 27/0623; H01L 29/1004; H01L 27/0649; H01L 29/407; H01L 29/0649
See application file for complete search history.

(56) References Cited

U.S. PATENT DOCUMENTS

| 7,692,240 B2 | 4/2010 | Ishida et al. |
| 2014/0191248 A1* | 7/2014 | Takaya ................ H01L 29/7827 257/77 |

FOREIGN PATENT DOCUMENTS

| JP | 2005-286042 A | 10/2005 |
| JP | 4764998 B2 | 9/2011 |

* cited by examiner

*Primary Examiner* — Amar Movva
(74) *Attorney, Agent, or Firm* — Foley & Lardner LLP

(57) ABSTRACT

A semiconductor device includes a first semiconductor region of a first conductivity type, a second semiconductor region of a second conductivity type, a third semiconductor region of the first conductivity type, first and second electrodes, second and third insulating units, and gate electrodes provided in the first semiconductor region and the second semiconductor region via a first insulating unit and extending in a first direction. The first electrode is provided on and electrically connected to the third semiconductor region. The second insulating unit is spaced apart from the gate electrodes in the first semiconductor region and extends in a second direction. The third insulating unit includes an insulating portion extending in the first direction and positioned between the gate electrodes and the second insulating unit in the second direction. The second electrode is electrically connected to the gate electrodes and provided on the second and third insulating units.

4 Claims, 19 Drawing Sheets

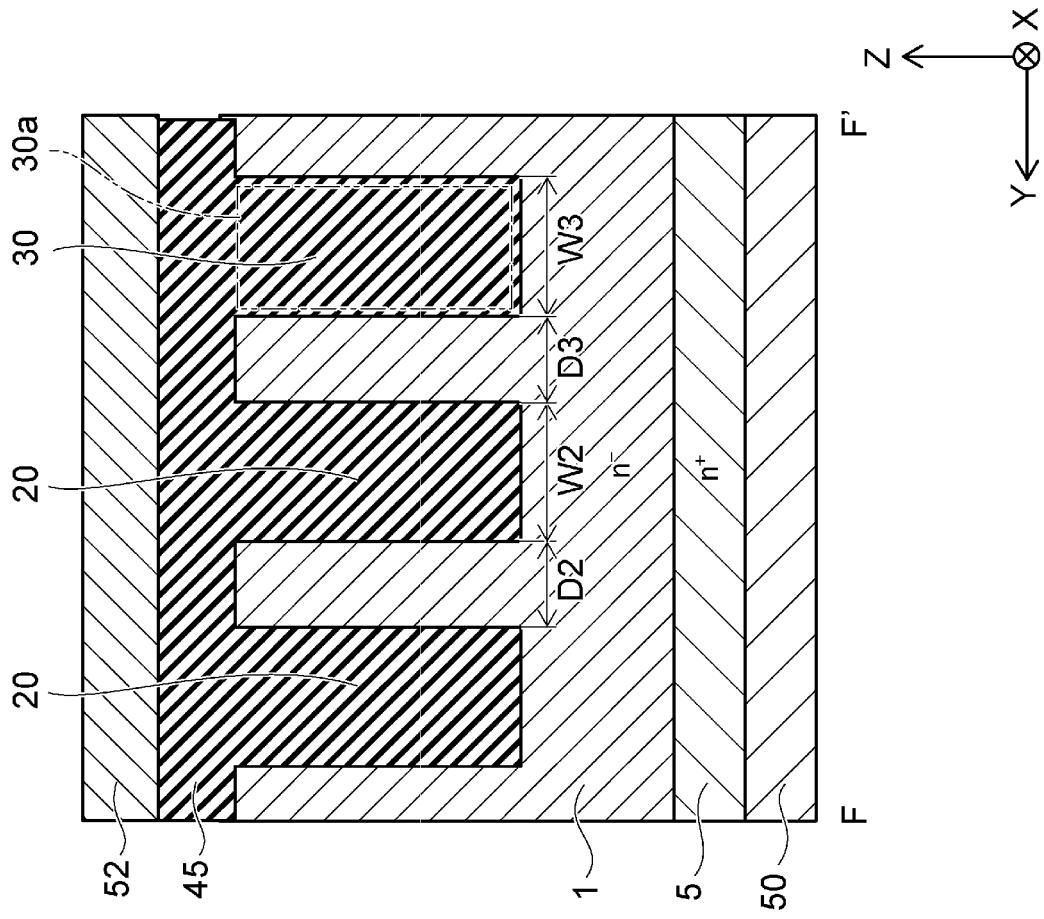
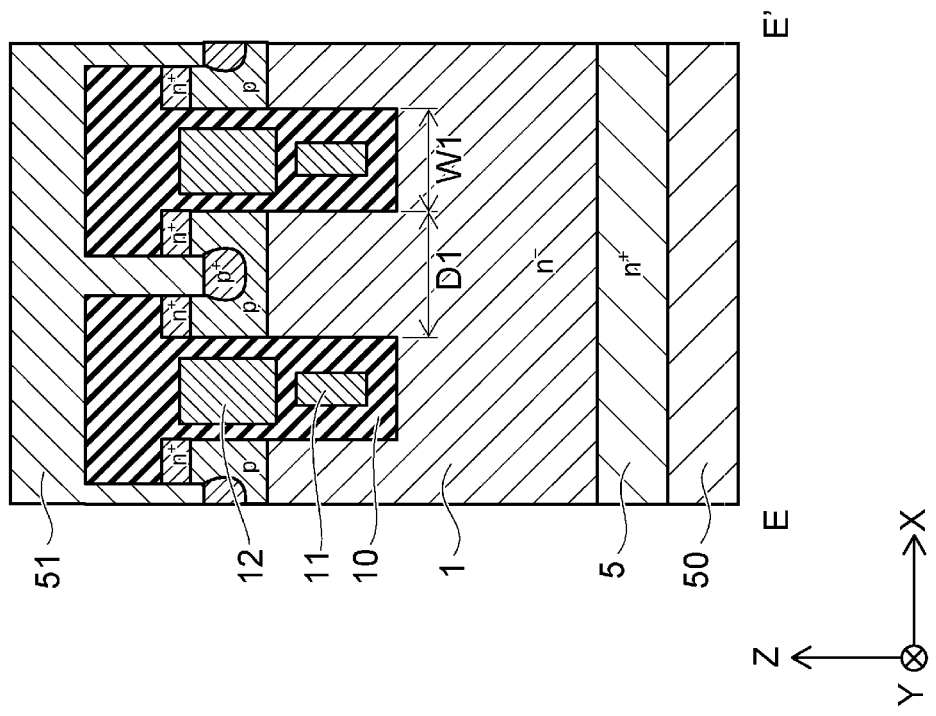

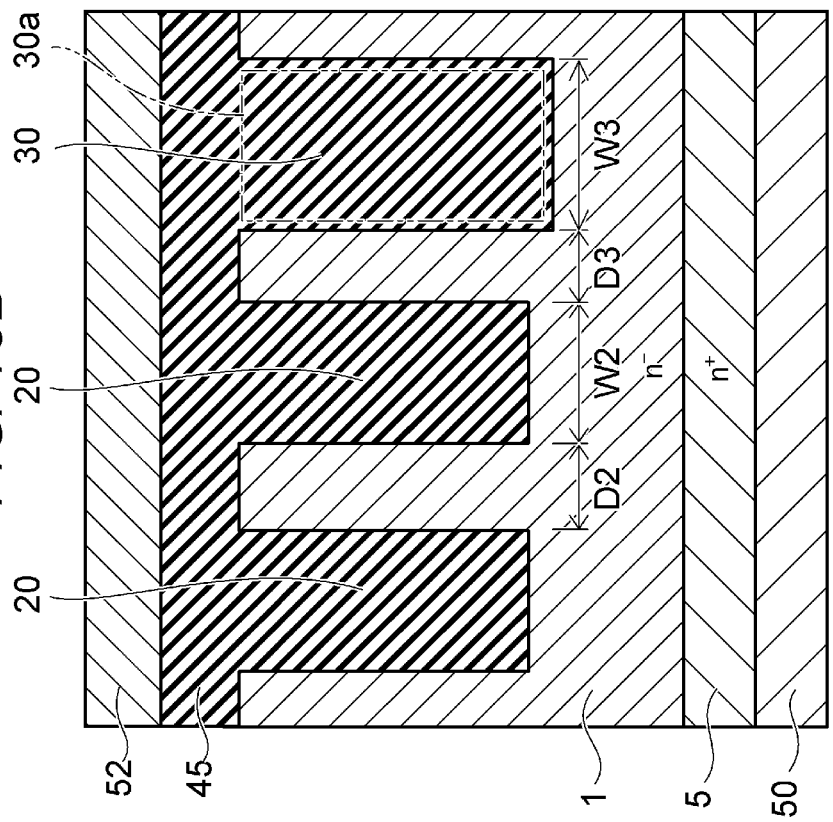
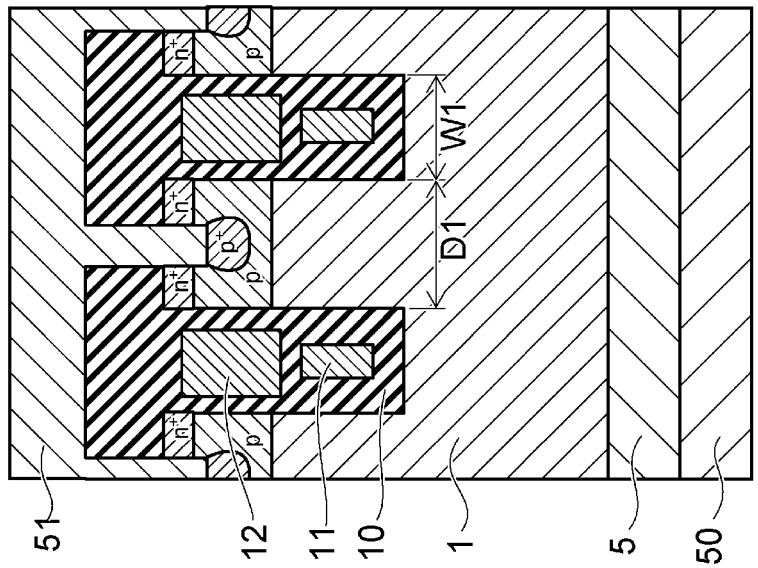

SEMICONDUCTOR DEVICE

CROSS-REFERENCE TO RELATED APPLICATION

This application claims the benefit of and priority to Japanese Patent Application No. 2016-180766, filed Sep. 15, 2016, the entire contents of which are incorporated herein by reference.

FIELD

Embodiments described herein relate generally to a semiconductor device.

BACKGROUND

A semiconductor device such as a metal oxide semiconductor field effect transistor (MOSFET) includes a parasitic transistor.

SUMMARY

In some embodiments according to one aspect, a semiconductor device may include a first semiconductor region of a first conductivity type, a second semiconductor region of a second conductivity type that is selectively provided on the first semiconductor region, a third semiconductor region of the first conductivity type that is selectively provided on the second semiconductor region, gate electrodes, a first electrode, a second insulating unit, a third insulating unit, and a second electrode. The gate electrodes may be provided in the first semiconductor region and the second semiconductor region via a first insulating unit and extend in a first direction. The first electrode may be provided on the third semiconductor region and electrically connected to the third semiconductor region. The second insulating unit may be spaced apart from the gate electrodes in the first semiconductor region and extend in a second direction intersecting the first direction. The third insulating unit may include a first insulating portion extending in the first direction, in which the first insulating portion is positioned between the gate electrodes and the second insulating unit in the second direction and is spaced apart from the gate electrodes and the second insulating unit in the first semiconductor region. The second electrode may be provided on the second insulating unit and the third insulating unit, and electrically connected to the gate electrodes.

In some embodiments according to another aspect, a semiconductor device may include a first semiconductor region of a first conductivity type, a second semiconductor region of a second conductivity type that is selectively provided on the first semiconductor region, a third semiconductor region of the first conductivity type that is selectively provided on the second semiconductor region, gate electrodes, a first electrode, a second insulating unit, a third insulating unit, and a second electrode. The gate electrodes may be provided in the first semiconductor region and the second semiconductor region via a first insulating unit and extend in a first direction. The first electrode may be provided on the third semiconductor region and electrically connected to the third semiconductor region. The second insulating unit may be spaced apart from the gate electrodes in the first semiconductor region and extend in the first direction. The third insulating unit may include a second insulating portion extending in a second direction intersecting the first direction, in which the second insulating portion is positioned between the gate electrodes and the second insulating unit in the first direction and is spaced apart from the gate electrodes and the second insulating unit in the first semiconductor region. The second electrode may be provided on the second insulating unit and the third insulating unit, and electrically connected to the gate electrodes.

In some embodiments according to still another aspect, a semiconductor device may include a first semiconductor region of a first conductivity type, a second semiconductor region of a second conductivity type that is selectively provided on the first semiconductor region, a third semiconductor region of the first conductivity type that is selectively provided on the second semiconductor region, gate electrodes, a first electrode, an annular second insulating unit, and a second electrode. The gate electrodes may be provided in the first semiconductor region and the second semiconductor region via a first insulating unit. The first electrode may be provided on the third semiconductor region and electrically connected to the third semiconductor region. The annular second insulating unit may be spaced apart from the gate electrodes in the first semiconductor region and surround a portion of the first semiconductor region. The second electrode may be provided on the second insulating unit and electrically connected to the gate electrodes.

Other aspects and embodiments of the disclosure are also encompassed. The foregoing summary and the following detailed description are not meant to restrict the disclosure to any particular embodiment but are merely meant to describe some embodiments of the disclosure.

DESCRIPTION OF THE DRAWINGS

FIG. 12A is a sectional view that is taken along line E-E' in FIG. 11, and FIG. 12B is a sectional view that is taken along line F-F' in FIG. 11.

FIGS. 13A and 13B are partially enlarged sectional views illustrating another example of the semiconductor device according to the second modification example of some embodiments.

DETAILED DESCRIPTION

Figure 1:
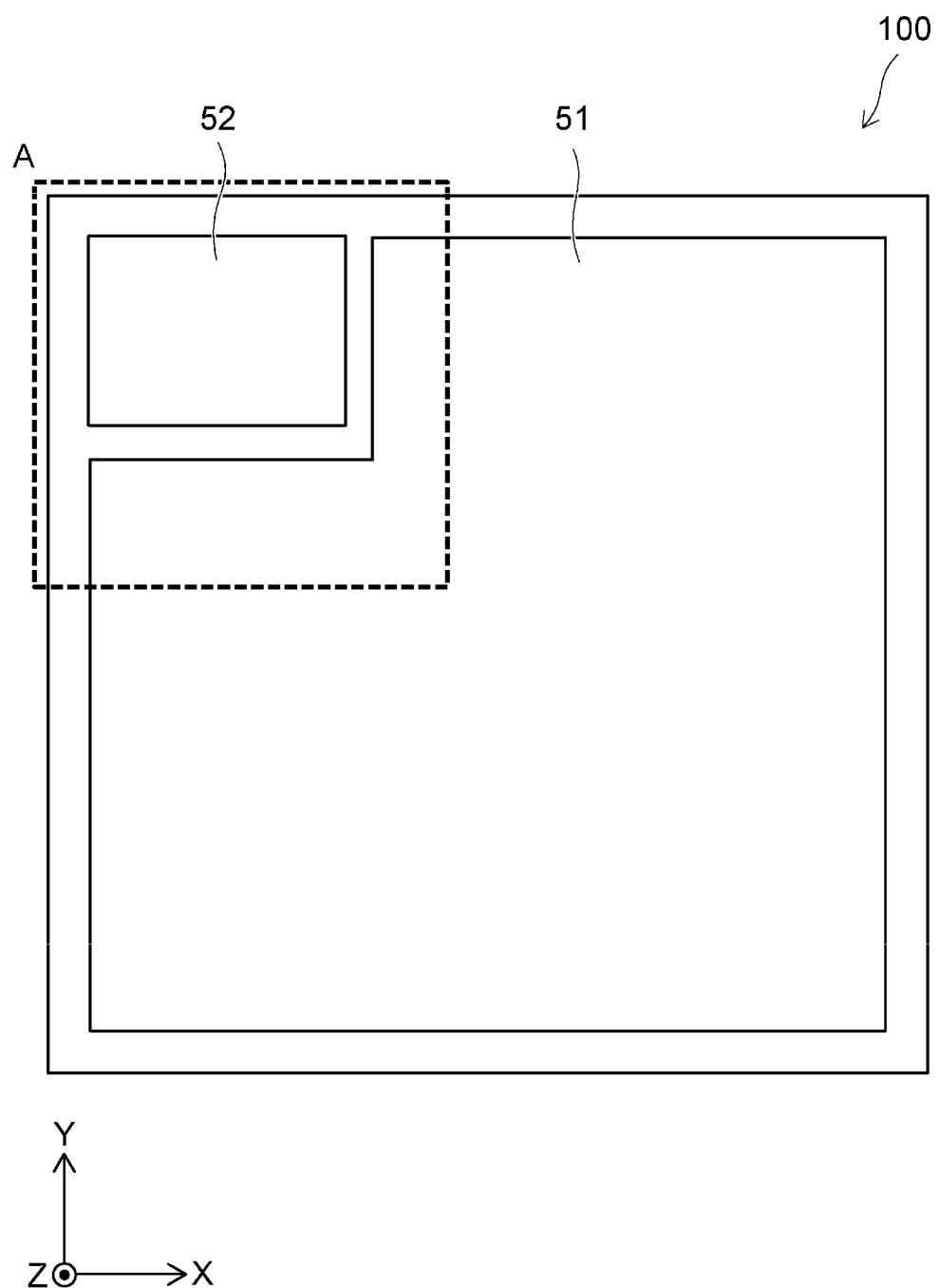
FIG. 1 is a plan view of a semiconductor device according to some embodiments.

Embodiments described herein provide a semiconductor device in which an operation of a parasitic transistor can be suppressed.

In general, according to some embodiments, a semiconductor device includes a first semiconductor region of a first conductivity type, a second semiconductor region of a second conductivity type, a third semiconductor region of the first conductivity type, gate electrodes, a first electrode, a second insulating unit, a third insulating unit, and a second electrode. The second semiconductor region is selectively provided on the first semiconductor region. The third semiconductor region is selectively provided on the second semiconductor region. The gate electrodes are provided in the first semiconductor region and the second semiconductor region via a first insulating unit. The gate electrodes extend in the first direction. The first electrode is provided on the third semiconductor region. The first electrode is electrically connected to the third semiconductor region. The second insulating unit is spaced apart from the gate electrodes in the first semiconductor region. The second insulating unit extends in a second direction intersecting the first direction. The third insulating unit includes a first insulating portion extending in the first direction. The first insulating portion of the third insulating unit is positioned between the gate electrodes and the second insulating unit in the second direction. The third insulating unit is spaced apart from the gate electrodes and the second insulating unit in the first semiconductor region. The second electrode is provided on the second insulating unit and the third insulating unit. The second electrode is electrically connected to the gate electrodes.

Hereinafter, each embodiment of exemplary embodiments will be described with reference to the drawings.

Moreover, the drawings are schematic or conceptual and a relationship between a thickness and a width of each portion, a ratio of sizes between the portions, and the like are not necessarily the same as actual ones. In addition, even in a case of representing the same portion, dimensions and ratios may be represented differently depending on the drawings.

In addition, in the disclosure of the present application and each drawing, the same reference numerals are given to the same elements that are described already and detailed description will be appropriately omitted.

In description of each embodiment, an XYZ orthogonal coordinate system is used. A direction from a drain electrode 50 to a source electrode 51 is defined as a Z direction. In addition, two directions that are perpendicular to the Z direction and orthogonal to each other are defined as an X direction (second direction) and a Y direction (first direction). By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

In the following description, notation of $n^+$, $n^-$, $p^+$, and p represents a relative height of an impurity concentration in each conductivity type. That is, the notation with "+" is relatively higher in the impurity concentration than that in the notation without "+" and "−" and the notation with "−" is relatively lower in the impurity concentration than that in the notation without "+" and "−".

In each embodiment described below, each embodiment may be carried out by inverting a p-type and an n-type of each semiconductor region.

An example of a semiconductor device according to some embodiments will be described with reference to FIGS. 1 to 5.

FIG. 1 is a plan view of a semiconductor device 100 according to some embodiments.

Figure 2:
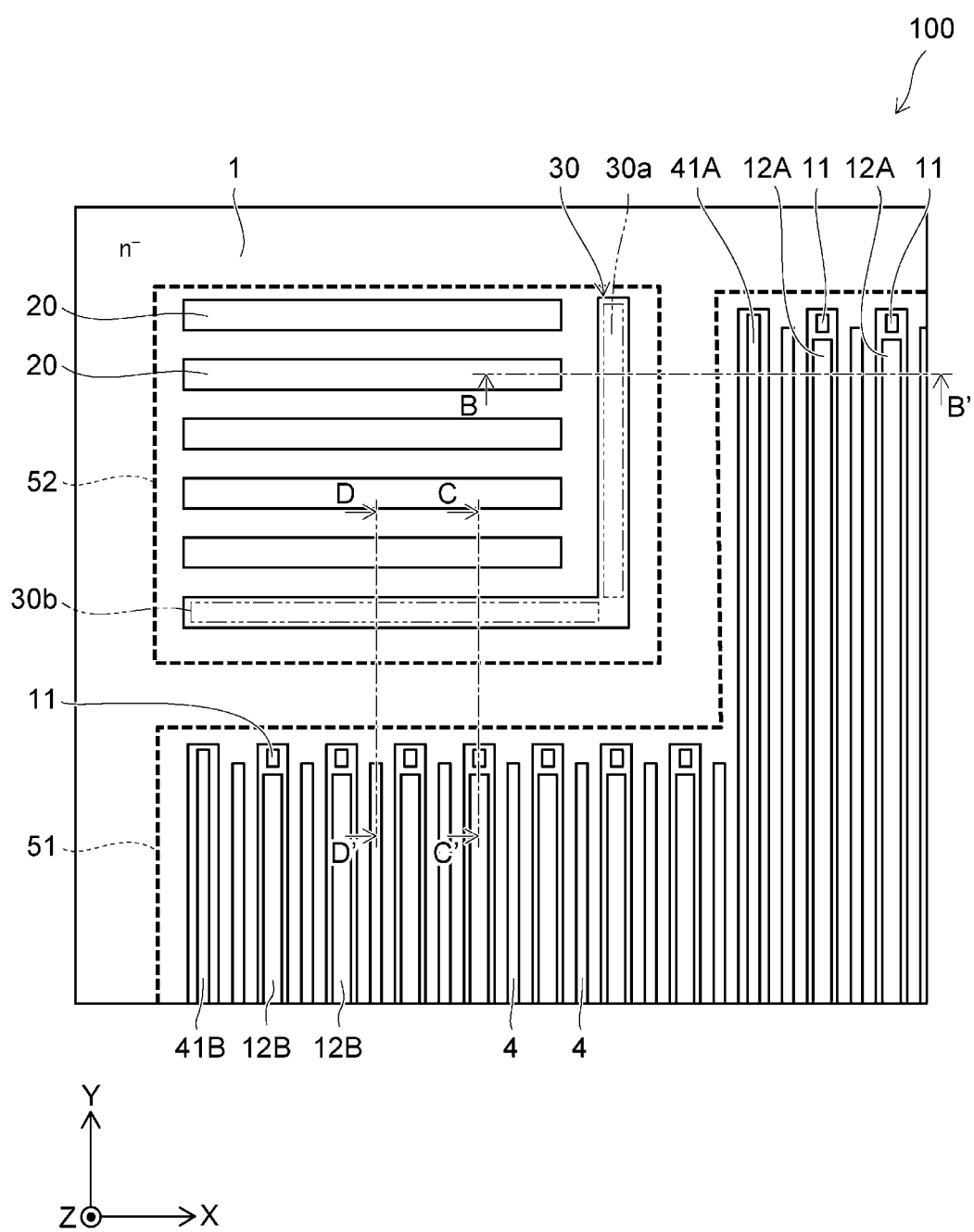
FIG. 2 is an enlarged plan view of portion A in FIG. 1.

FIG. 2 is an enlarged plan view of portion A in FIG. 1.

Figure 3:
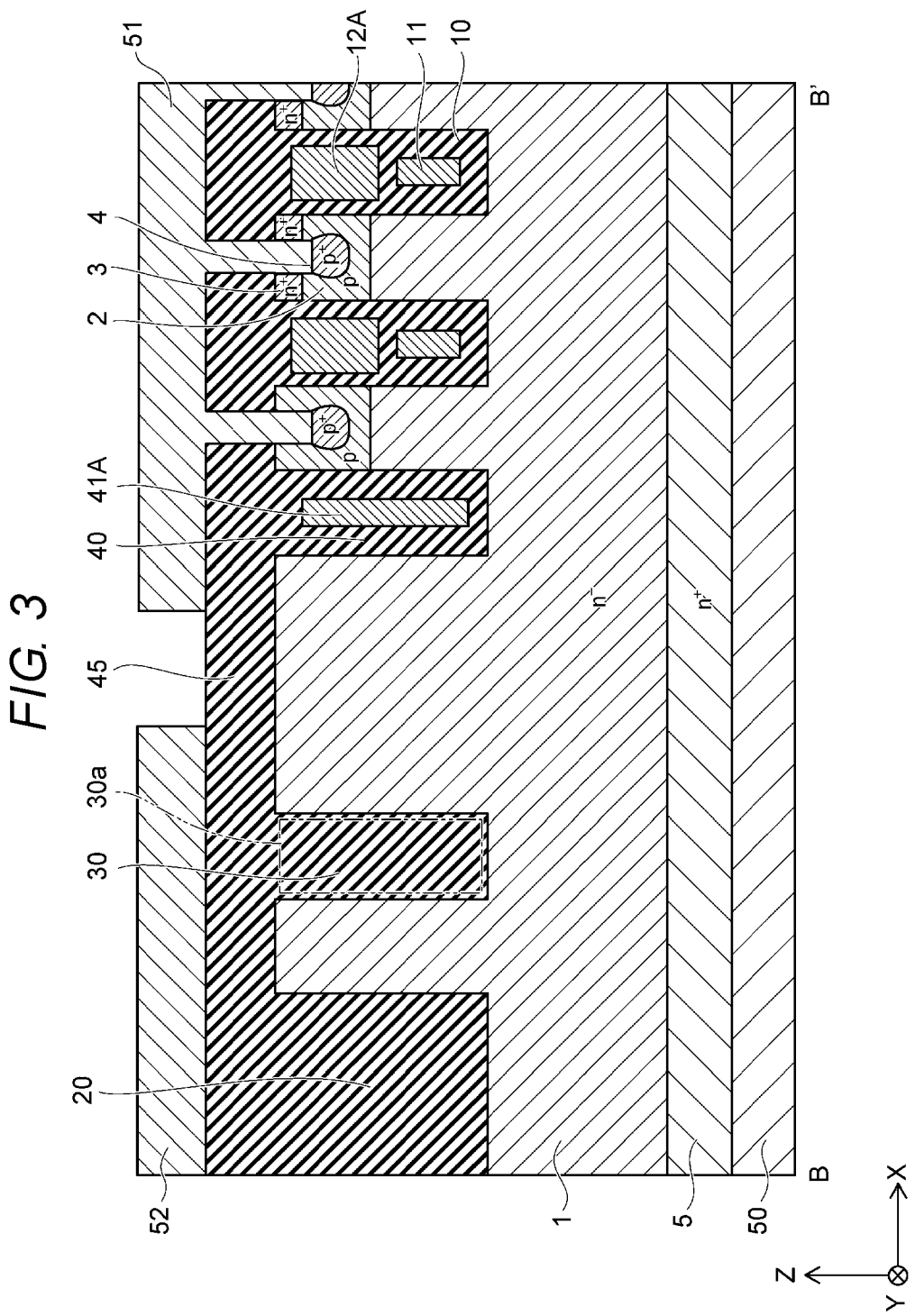
FIG. 3 is a sectional view that is taken along line B-B' in FIG. 2.

FIG. 3 is a sectional view that is taken along line B-B' in FIG. 2.

Figure 4:
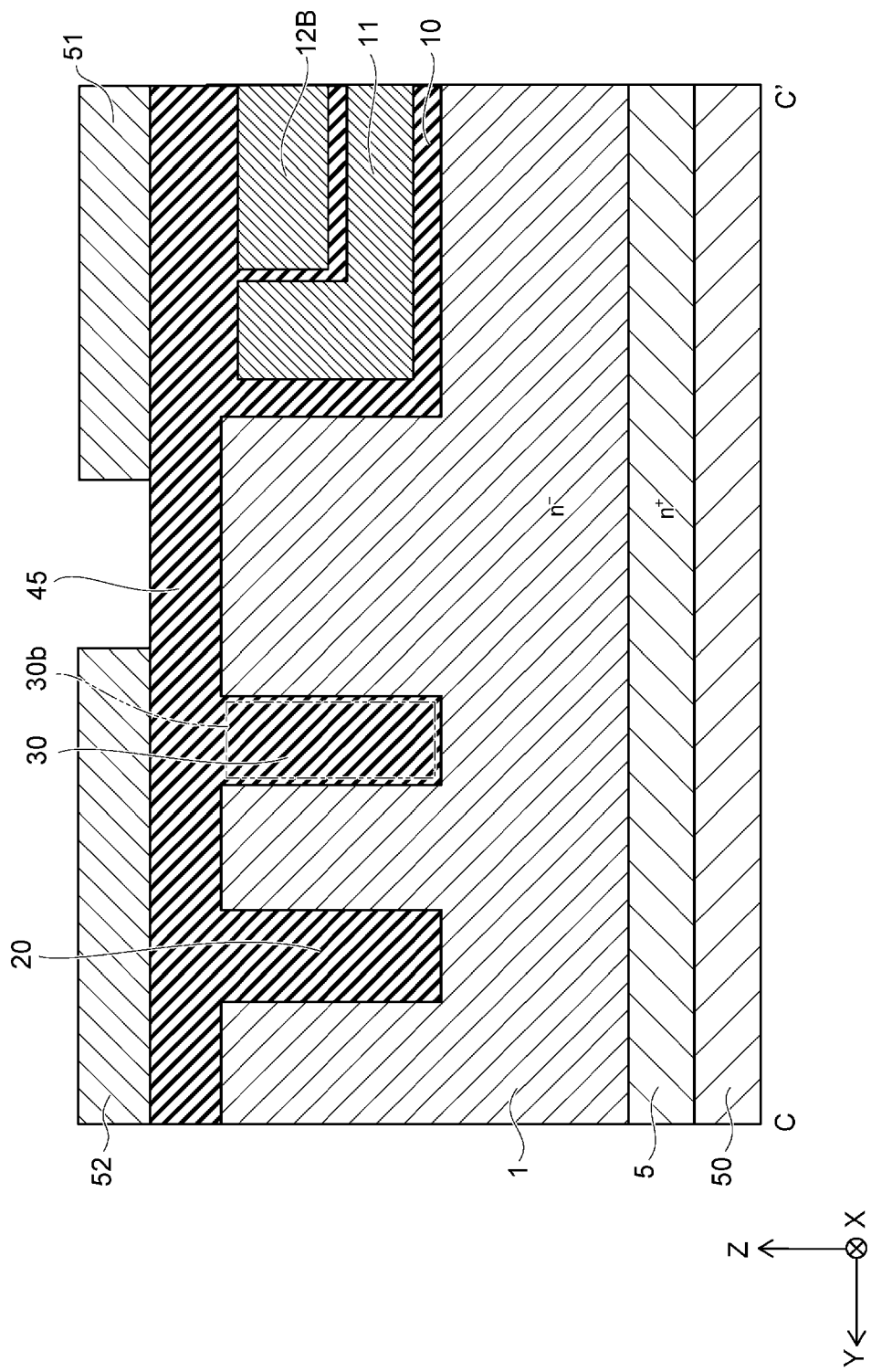
FIG. 4 is a sectional view that is taken along line C-C' in FIG. 2.

FIG. 4 is a sectional view that is taken along line C-C' in FIG. 2.

Figure 5:
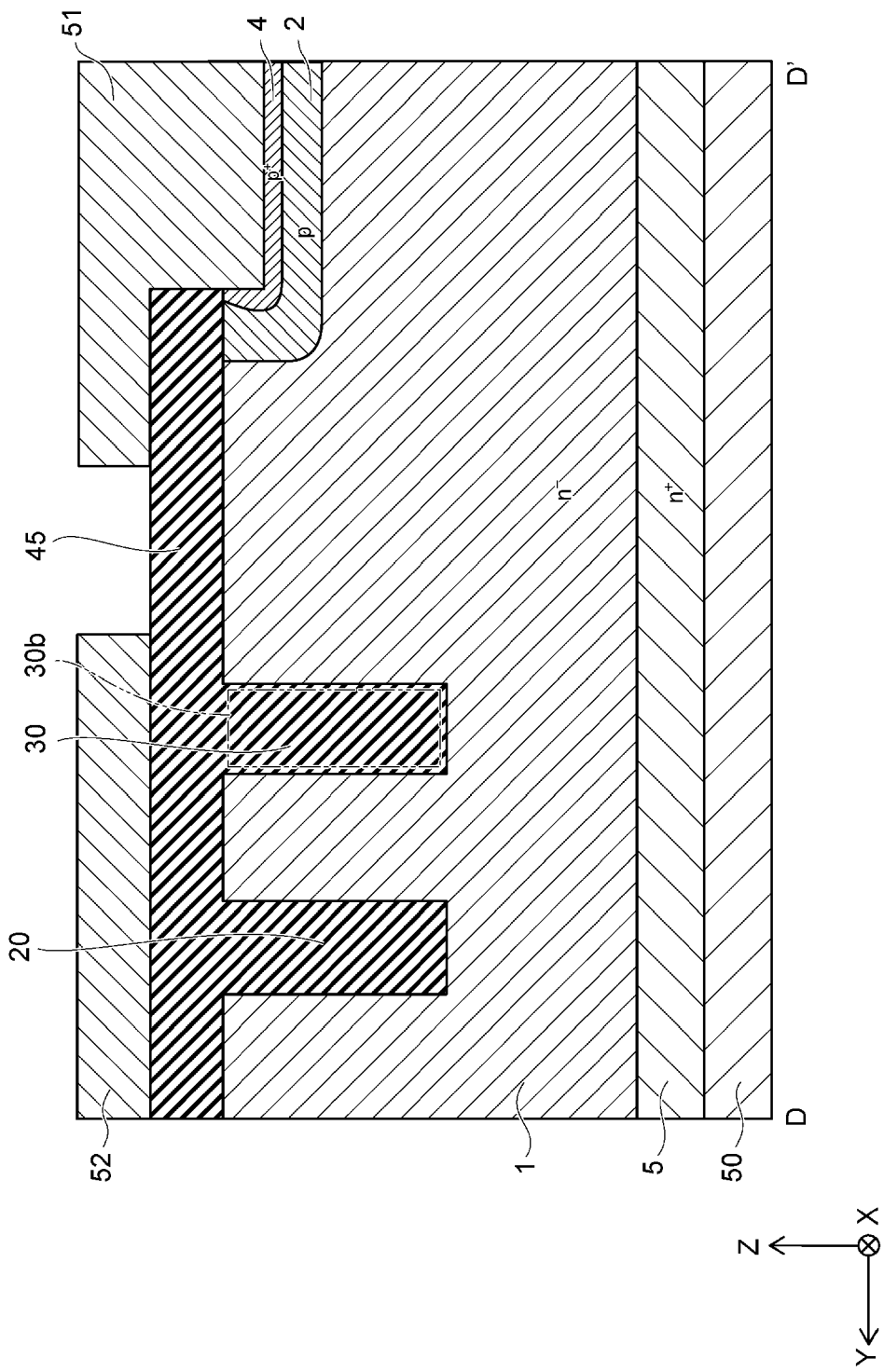
FIG. 5 is a sectional view that is taken along line D-D' in FIG. 2.

FIG. 5 is a sectional view that is taken along line D-D' in FIG. 2.

Moreover, in FIG. 2, the source electrode 51 and a gate pad 52 are indicated by broken lines, and an insulating layer 45, a p-type base region 2, and an $n^+$-type source region 3 are omitted.

The semiconductor device 100 is, for example, a metal oxide semiconductor field effect transistor (MOSFET).

As illustrated in FIGS. 1 to 4, in some embodiments, the semiconductor device 100 includes an $n^-$-type (e.g., as a first conductivity type) semiconductor region 1 (e.g., as a first semiconductor region), the p-type (e.g., as a second conductivity type) base region 2 (e.g., as a second semiconductor region), an $n^+$-type source region 3 (e.g., as a third semiconductor region), a $p^+$-type contact region 4, an $n^+$-type drain region 5, an insulating unit 10 (e.g., as a first insulating unit), a field plate electrode (hereinafter, referred to as a FP electrode) 11, gate electrodes 12A and 12B, an insulating unit 20 (e.g., as a second insulating unit), an insulating unit 30 (e.g., as a third insulating unit), an insulating unit 40, FP electrodes 41A and 41B, the insulating layer 45, the drain electrode 50, the source electrode 51 (e.g., as a first electrode), and the gate pad 52 (e.g., as a second electrode).

As illustrated in FIG. 1, in some embodiments, the source electrode 51 and the gate pad 52 are provided on an upper surface of the semiconductor device 100. In some embodiments, the source electrode 51 and the gate pad 52 spaced apart and are electrically isolated from each other.

As illustrated in FIG. 2, in some embodiments, a plurality of gate electrodes 12A and a plurality of gate electrodes 12B electrically connected to the gate pad 52 are provided below the source electrode 51. The plurality of gate electrodes 12A and the plurality of gate electrodes 12B are arranged in the X direction and each thereof extends in the Y direction. When viewed from the Z direction, the gate pad 52 is aligned with the gate electrodes 12B and is not aligned with the gate electrodes 12A in the Y direction. Therefore, a length of the gate electrode 12B in the Y direction is shorter than a length of the gate electrode 12A in the Y direction.

Hereinafter, for properties common to the gate electrode 12A and the gate electrode 12B, the gate electrodes are collectively referred to as "gate electrode 12" and will be described.

In some embodiments, a plurality of insulating units 20 are aligned below the gate pad 52 in the Y direction. Each insulating unit 20 extends in the X direction. A portion of the gate electrodes 12A is aligned with the insulating units 20 in the X direction. In addition, the gate electrodes 12B are aligned with a portion of the insulating units 20 in the Y direction.

In some embodiments, the insulating unit 30 includes a first insulating portion 30a extending in the Y direction and a second insulating portion 30b extending in the X direction. The first insulating portion 30a is positioned between the plurality of insulating units 20 and the plurality of gate electrodes 12A in the X direction. The second insulating portion 30b is positioned between the plurality of insulating units 20 and the plurality of gate electrodes 12B in the Y direction.

In some embodiments, the FP electrodes 41A and 41B are provided below the source electrode 51. When viewed from the Z direction, the gate pad 52 is aligned with the FP electrode 41B and is not aligned with the FP electrode 41A in the Y direction. Therefore, in some embodiments, a length of the FP electrode 41B in the Y direction is shorter than a length of the FP electrode 41A in the Y direction.

A portion of the FP electrode 41A is positioned between a portion of the gate electrode 12A and the insulating unit 30 in the X direction. The FP electrode 41B is positioned in the plurality of gate electrodes 12B on an outer periphery side of the semiconductor device. The gate electrodes 12B are provided between a portion of the FP electrode 41A and the FP electrode 41B in the X direction.

Hereinafter, for properties common to the FP electrodes 41A and 41B, the FP electrodes are collectively referred to as "FP electrode 41" and will be described.

As illustrated in FIGS. 3 to 5, in some embodiments, the drain electrode 50 is provided on a lower surface of the semiconductor device 100.

An $n^+$-type drain region 5 is provided on the drain electrode 50 and is electrically connected to the drain electrode 50.

The $n^-$-type semiconductor region 1 is provided on the $n^+$-type drain region 5.

The p-type base region 2 is selectively provided on the $n^-$-type semiconductor region 1.

The $n^+$-type source region 3 and the $p^+$-type contact region 4 are selectively provided on the p-type base region 2.

In some embodiments, the FP electrode 11 is provided in the $n^-$-type semiconductor region 1 via the insulating unit 10.

The gate electrode 12 is provided in the $n^-$-type semiconductor region 1 and the p-type base region 2 via the insulating unit 10. The gate electrode 12 is positioned above the FP electrode 11 and is spaced apart from the FP electrode 11. As illustrated in FIG. 4, in some embodiments, an end portion of the FP electrode 11 in the Y direction is bent toward the Z direction and is aligned with the gate electrode 12 in the Y direction.

In some embodiments, a portion of the source electrode 51 is provided in the p-type base region 2 and is electrically connected to the $n^+$-type source region 3 and the $p^+$-type contact region 4. The insulating layer 45 is provided between the gate electrode 12 and the source electrode 51, and these electrodes are electrically isolated from each other.

In some embodiments, the FP electrode 41 is provided in the $n^-$-type semiconductor region 1 and the p-type base region 2 via the insulating unit 40. The FP electrode 41 is spaced apart from the gate electrode 12 in the X direction.

The FP electrodes 11 and 41 are electrically connected to the source electrode 51 or the gate pad 52.

In some embodiments, the insulating units 20 and 30 are spaced apart from the p-type base region 2, the insulating unit 10, and the gate electrode 12, and are provided in the $n^-$-type semiconductor region 1. In addition, the insulating units 20 and 30 are spaced apart in the $n^-$-type semiconductor region 1 in the X direction (see FIG. 3) and in the Y direction (see FIG. 4).

In some embodiments, the $n^-$-type semiconductor region 1 around the insulating unit 20 and the insulating unit 30 is covered with the insulating layer 45 and the gate pad 52 is provided on the insulating layer 45 by being spaced apart from the source electrode 51. The insulating units 10, 20, and 30 are connected by the insulating layer 45. The insulating units 10, 20, and 30, and the insulating layer 45 are, for example, an insulating film that is integrally formed.

Here, an operation of the semiconductor device 100 will be described.

In some embodiments, with respect to the source electrode 51, in a state where a positive voltage is applied to the drain electrode 50, if a voltage of a threshold or more is applied to the gate electrode 12, the semiconductor device is in an ON state. In this case, a channel (inversion layer) may be formed in the p-type base region 2 in the vicinity of the insulating unit 10. Electrons may flow from the $n^+$-type source region 3 to the $n^-$-type semiconductor region 1 via the channel and may be discharged via the $n^+$-type drain region 5.

Thereafter, if the voltage applied to the gate electrode 12 is lower than the threshold, the channel may disappear in the p-type base region 2 and the semiconductor device may be in an OFF state.

In some embodiments, if the semiconductor device 100 is in the OFF state, a depletion layer may spread from an interface between the insulating unit 10 and the $n^-$-type semiconductor region 1 to the $n^-$-type semiconductor region 1 due to a potential difference between the FP electrode 11 and the drain electrode 50. A breakdown voltage of the semiconductor device can be increased by the depletion layer spreading from the interface between the insulating unit 10 and the $n^-$-type semiconductor region 1. Otherwise, in some embodiments, as the breakdown voltage of the semiconductor device is improved, an n-type impurity concentration can be increased in the $n^-$-type semiconductor region 1 and an ON-resistance of the semiconductor device can be reduced.

In addition, in some embodiments, the semiconductor device 100 includes a diode in which the p-type base region 2 is an anode and the $n^-$-type semiconductor region 1 is a cathode. Therefore, with respect to the drain electrode 50, when the positive voltage is applied to the source electrode 51, a forward current may flow from the drain electrode 50 to the source electrode 51.

Next, an example of a material of each configuration element will be described.

In some embodiments, the n⁻-type semiconductor region 1, the p-type base region 2, the n⁺-type source region 3, the p⁺-type contact region 4, and the n⁺-type drain region 5 may contain silicon, silicon carbide, gallium nitride, or gallium arsenide as a semiconductor material. In some embodiments, if silicon is used as the semiconductor material, arsenic, phosphorus, or antimony can be used as the n-type impurity. Boron can be used as a p-type impurity.

The FP electrode 11, the gate electrode 12, and The FP electrode 41 may contain a conductive material such as polysilicon.

The insulating units 10, 20, 30, and 40 may contain an insulating material such as silicon oxide.

The drain electrode 50, the source electrode 51, and the gate pad 52 may contain a metal such as aluminum.

Here, effects of the embodiments illustrated in FIGS. 1 to 5 will be described with reference to FIGS. 6 to 8.

Figure 6A:
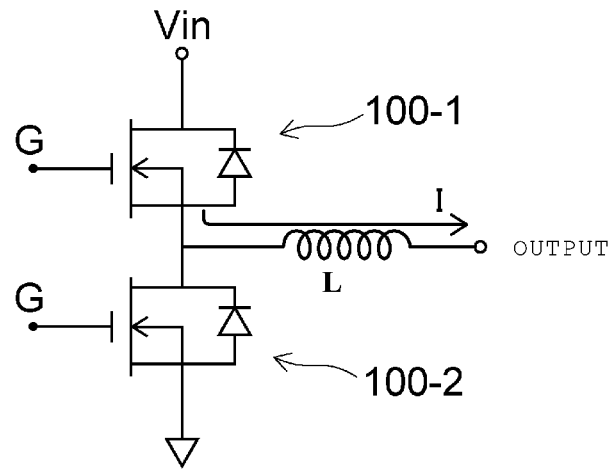
FIGS. 6A to 6C are circuit diagrams illustrating an example of an electric circuit to which the semiconductor device according to some embodiments is connected.
Figure 6B:
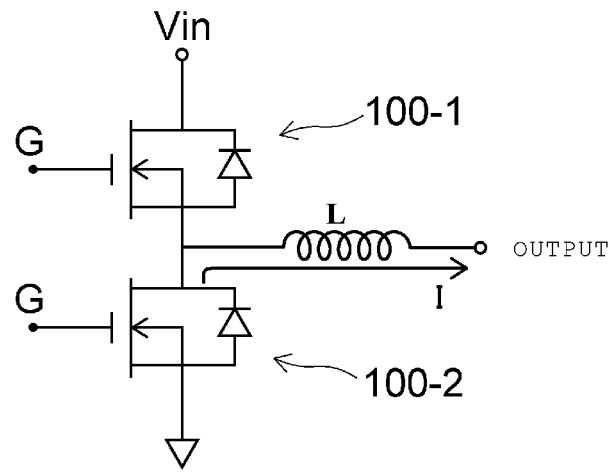
Figure 6C:
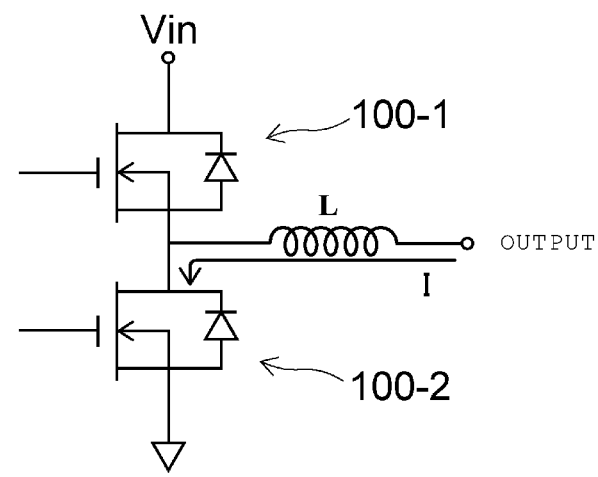

FIGS. 6A to 6C are circuit diagrams illustrating an example of an electric circuit to which the semiconductor device 100 according to some embodiments is connected.

Figure 7A:
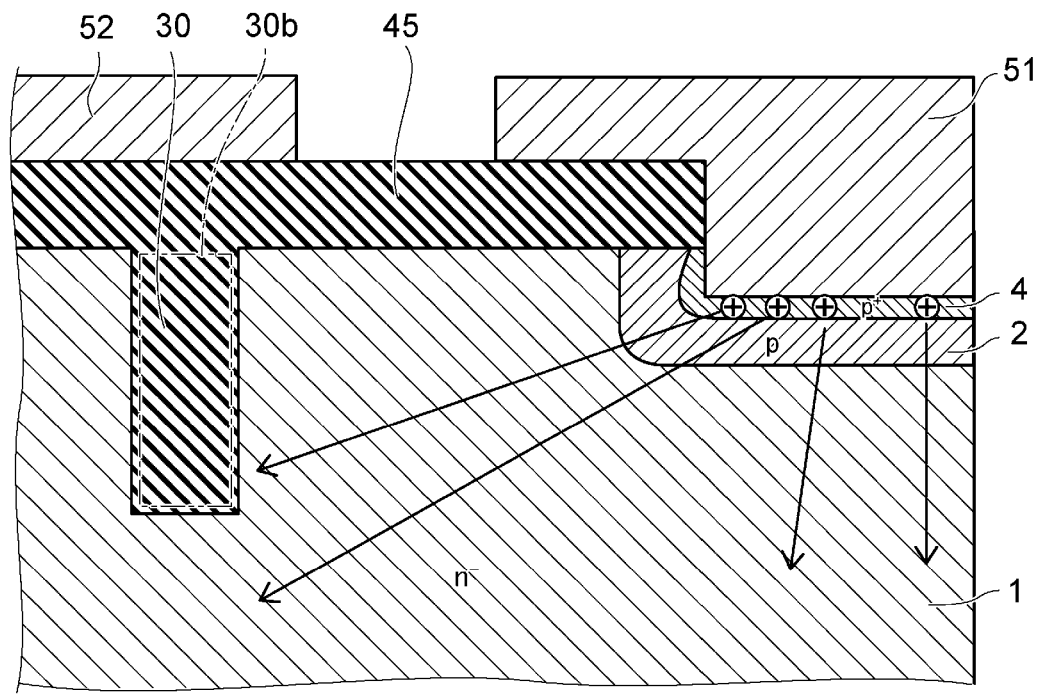
FIGS. 7A and 7B are sectional views illustrating a flow of a carrier in the semiconductor device according to some embodiments.
Figure 7B:
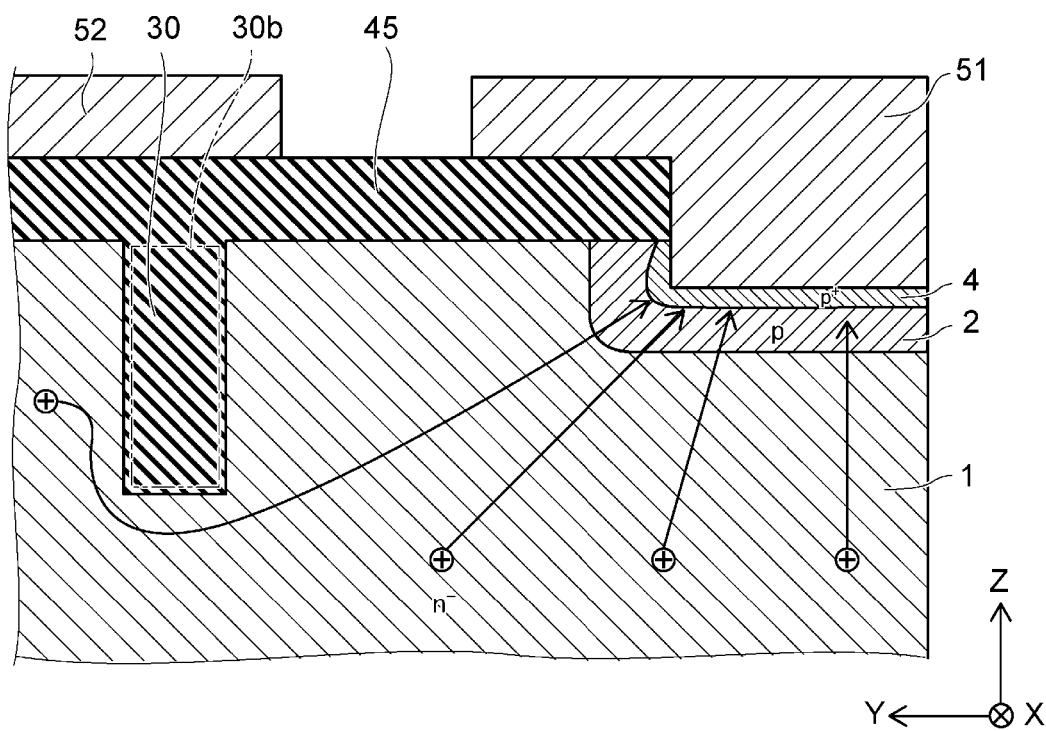

FIGS. 7A and 7B are sectional views illustrating a flow of a carrier in the semiconductor device according to some embodiments.

Figure 8:
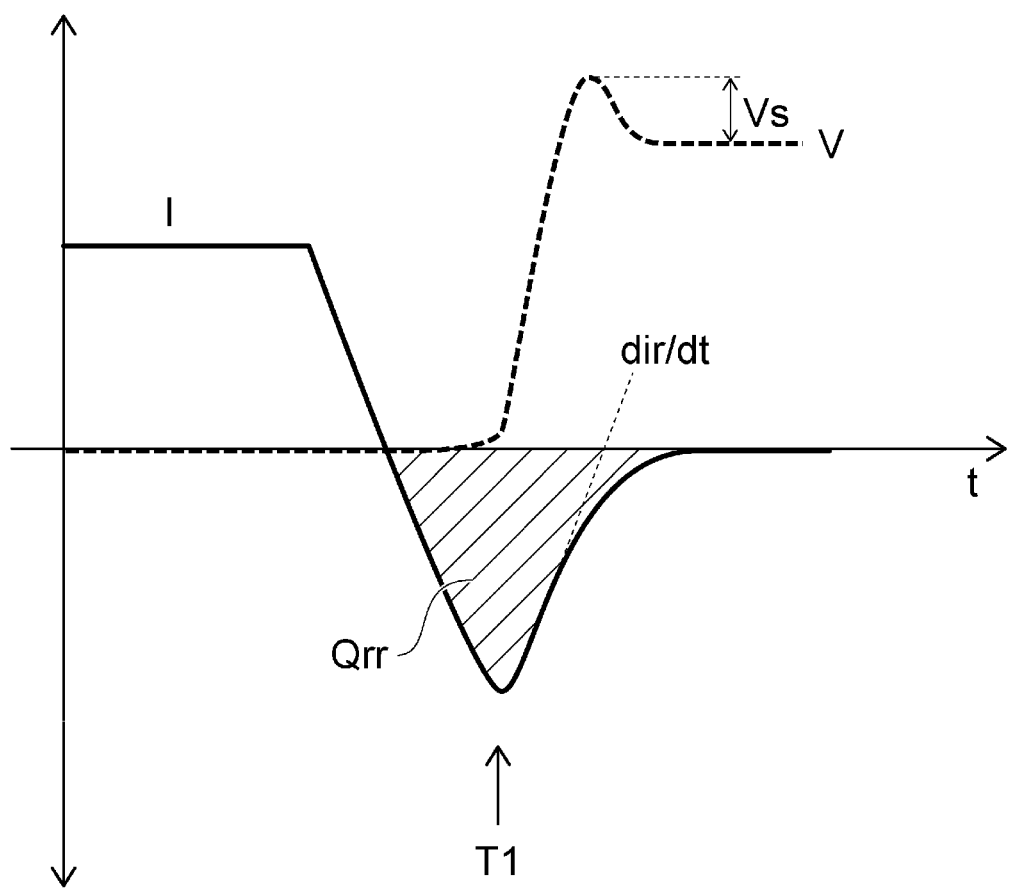
FIG. 8 is a graph illustrating a waveform of a current and a voltage in the semiconductor device in the electric circuit illustrated in FIGS. 6A to 6C.

FIG. 8 is a graph illustrating a waveform of a current and a voltage in a semiconductor device 100-2 in the electric circuit illustrated in FIGS. 6A to 6C.

Moreover, in FIG. 8, a solid line indicates a current flowing through a diode and a broken line indicates a voltage of the drain electrode 50 with respect to the source electrode 51. A horizontal axis indicates a time and the current of the diode flowing forward direction indicates as positive.

In the example illustrated in FIGS. 6A to 6C, two semiconductor devices 100-1 and 100-2 (each having a gate electrode G) according to some embodiments are used and a half bridge circuit is configured. FIG. 6A illustrates that the semiconductor device 100-1 is in an ON state, the semiconductor device 100-2 is in an OFF state, and a current I flows through the semiconductor device 100-1.

In the state illustrated in FIG. 6A, in some embodiments, if the semiconductor device 100-1 is turned off, an induced electromotive force can be generated due to an inductance L. Therefore, as illustrated in FIG. 6B, the forward current I can flow through the diode of the semiconductor device 100-2. In this case, as illustrated in FIG. 7A, positive holes can be injected from the source electrode 51 into the n⁻-type semiconductor region 1 via the p-type base region 2.

In some embodiments, if the forward current flows through the diode of the semiconductor device 100-2, the carriers accumulated in the semiconductor device 100-2 can be discharged. In this case, as illustrated in FIG. 7B, the positive holes can be discharged to the source electrode 51 via the p-type base region 2. The carriers can be discharged from the semiconductor device 100-2, whereby as illustrated in FIG. 6C, a reverse recovery current can flow from the drain electrode 50 to the source electrode 51 in the semiconductor device 100-2.

As illustrated in FIG. 8, in some embodiments, if the reverse recovery current flows at a timing T1, thereafter, a voltage V of the drain electrode 50 can be increased with respect to the source electrode 51 of the semiconductor device 100-2. In this case, a serge voltage Vs can be generated in the voltage V according to a gradient dir/dt of decrease of the reverse recovery current. If the dir/dt is large, the serge voltage Vs also can increase. If the serge voltage Vs is large, a parasitic NPN transistor configured with the n⁺-type source region 3, the p-type base region 2, and the n⁻-type semiconductor region 1 can become easy to operate. If the parasitic NPN transistor is operated, since a large current flows through the semiconductor device and the semiconductor device may be destroyed, in some embodiments, the dir/dt is caused to be small.

In addition, if an accumulated charge Qrr illustrated in FIG. 8 is large and the positive holes are concentrated and flow through a portion of the p-type base region 2 and the p⁺-type contact region 4, a base potential of a parasitic transistor increases and the parasitic transistor may be operated. Therefore, similar to the dir/dt, in some embodiments, the accumulated charge Qrr is also caused to be small.

A portion of the positive holes that are injected during the diode operation may also be accumulated in the n⁻-type semiconductor region 1 below the gate pad 52. The positive holes accumulated in the n⁻-type semiconductor region 1 below the gate pad 52 may be moved to be arranged to the near p-type base region 2 and are discharged to the source electrode 51 during a reverse recovery operation. Therefore, since more positive holes flow through the p-type base region 2 near to the n⁻-type semiconductor region 1 below the gate pad 52 than other portions, the parasitic NPN transistor may be more easily operated.

Therefore, in some embodiments, a decrease in the charge Qrr that is accumulated below the gate pad 52 and a decrease in the dir/dt during the reverse recovery by the carriers accumulated below the gate pad 52 can be particularly effective for suppressing the operation of the parasitic NPN transistor.

In this respect, as the semiconductor device 100 according to some embodiments, the insulating unit 20 is provided in the n⁻-type semiconductor region 1 below the gate pad 52 and thereby it is possible to decrease a volume of the n⁻-type semiconductor region 1 below the gate pad 52. Therefore, it is possible to decrease the charge Qrr accumulated below the gate pad 52.

In addition, in some embodiments, the plurality of insulating units 20 are provided and thereby a portion of the positive holes injected into the n⁻-type semiconductor region 1 can be accumulated between the insulating units 20. The positive holes accumulated in the n⁻-type semiconductor region 1 between the insulating units 20 can be inhibited from moving by the insulating units 20 during the reverse recovery operation and it is difficult to move to the source electrode 51. Therefore, a time required for the reverse recovery can be lengthened and the dir/dt can be reduced.

Furthermore, in the semiconductor device 100 according to some embodiments, the first insulating portion 30a of the insulating unit 30 extends between the plurality of insulating units 20 and the plurality of gate electrodes 12A in the Y direction. In some embodiments, when the positive holes accumulated in the n⁻-type semiconductor region 1 between the insulating units 20 are moved toward the source electrode 51, the movement thereof can be inhibited by the first insulating portion 30a by employing such a configuration during the reverse recovery operation. Therefore, the time required for the reverse recovery can be lengthened and the dir/dt can be further reduced.

That is, according to some embodiments, the insulating units 20 and 30 are provided, whereby the accumulated charge Qrr is reduced and the dir/dt can be reduced. Therefore, a possibility that the parasitic NPN transistor is operated can be reduced.

Here, a semiconductor device of some embodiments will be described with reference to FIG. 9.

Figure 9:
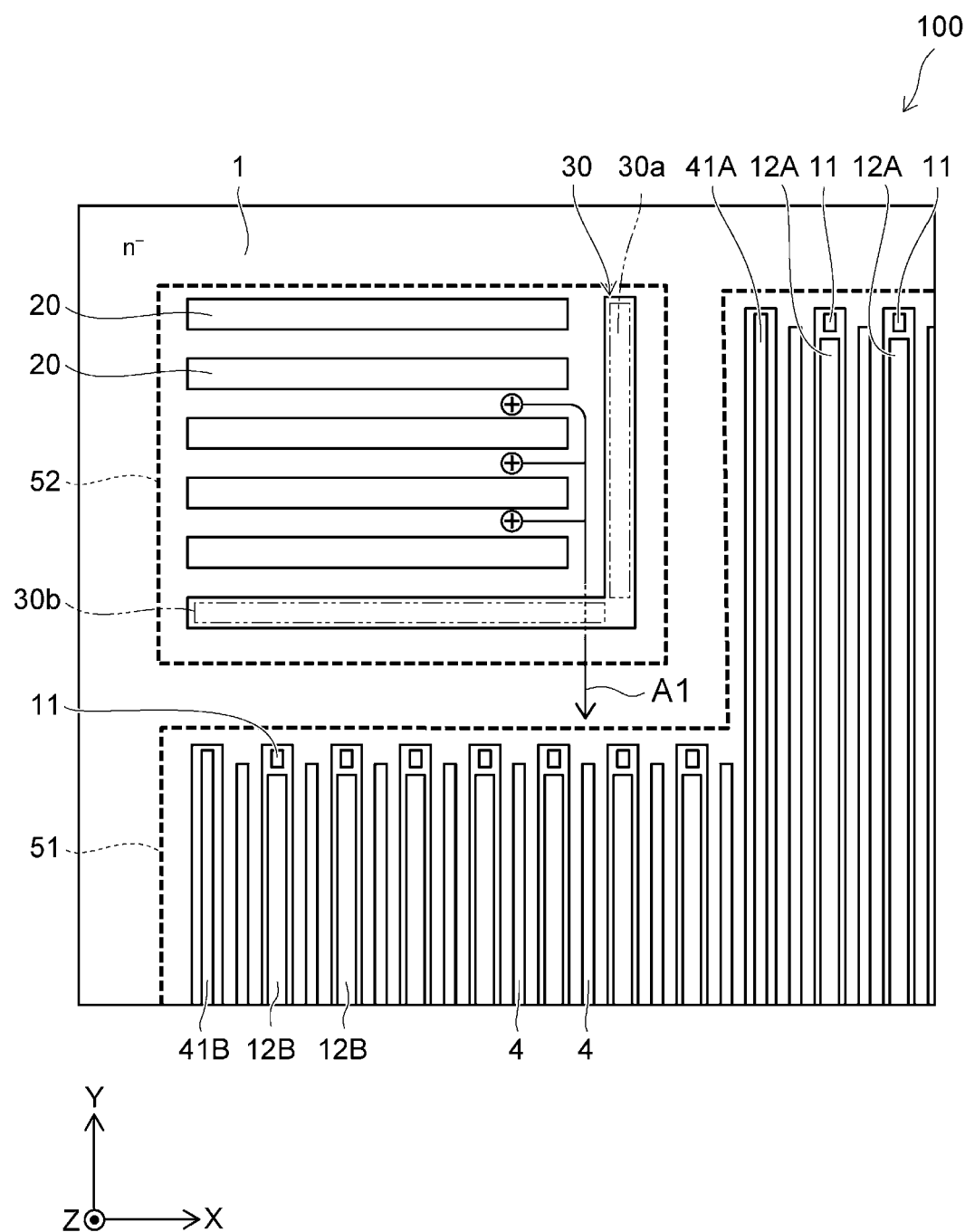
FIG. 9 is a plan view of a semiconductor device according to some embodiments.

FIG. 9 is a plan view of the semiconductor device according to some embodiments.

The first insulating portion 30a is spaced apart from the plurality of insulating units 20 in the X direction. If the insulating unit 30 only includes the first insulating portion 30a, as indicated by arrow A1 in FIG. 9, the positive holes accumulated between the insulating units 20 may flow through a gap between the insulating unit 20 and the insulating unit 30, and may flow through the p$^+$-type contact region 4. The positive holes flowing through the gap between the insulating units 20 and 30 may be concentrated and flow through a portion of the p$^+$-type contact region 4, and the parasitic NPN transistor may be operated.

In some embodiments, the insulating unit 30 includes the second insulating portion 30b in addition to the first insulating portion 30a, whereby, as indicated by the arrow A1, the positive holes flowing through the gap between the insulating units 20 and 30 in the -Y direction can be reduced. Therefore, it is possible to suppress that a portion of the positive holes is concentrated and flows through the p$^+$-type contact region 4, and to further reduce a possibility that the parasitic NPN transistor is operated.

In addition, during the reverse recovery operation, a potential of the n$^-$-type semiconductor region 1 is higher than a potential of the p-type base region 2 and is higher than a potential of the FP electrode 41A connected to the source electrode 51. Therefore, in some embodiments, the FP electrode 41A is provided between the insulating units 20 and 30, and the gate electrode 12A, whereby the positive holes passing through the vicinity of the FP electrode 41A can be trapped by the FP electrode 41A during the reverse recovery. Therefore, it is possible to further reduce a possibility that the charge Qrr (see FIG. 8) is reduced and the parasitic NPN transistor is operated.

First Modification Example

Figure 10:
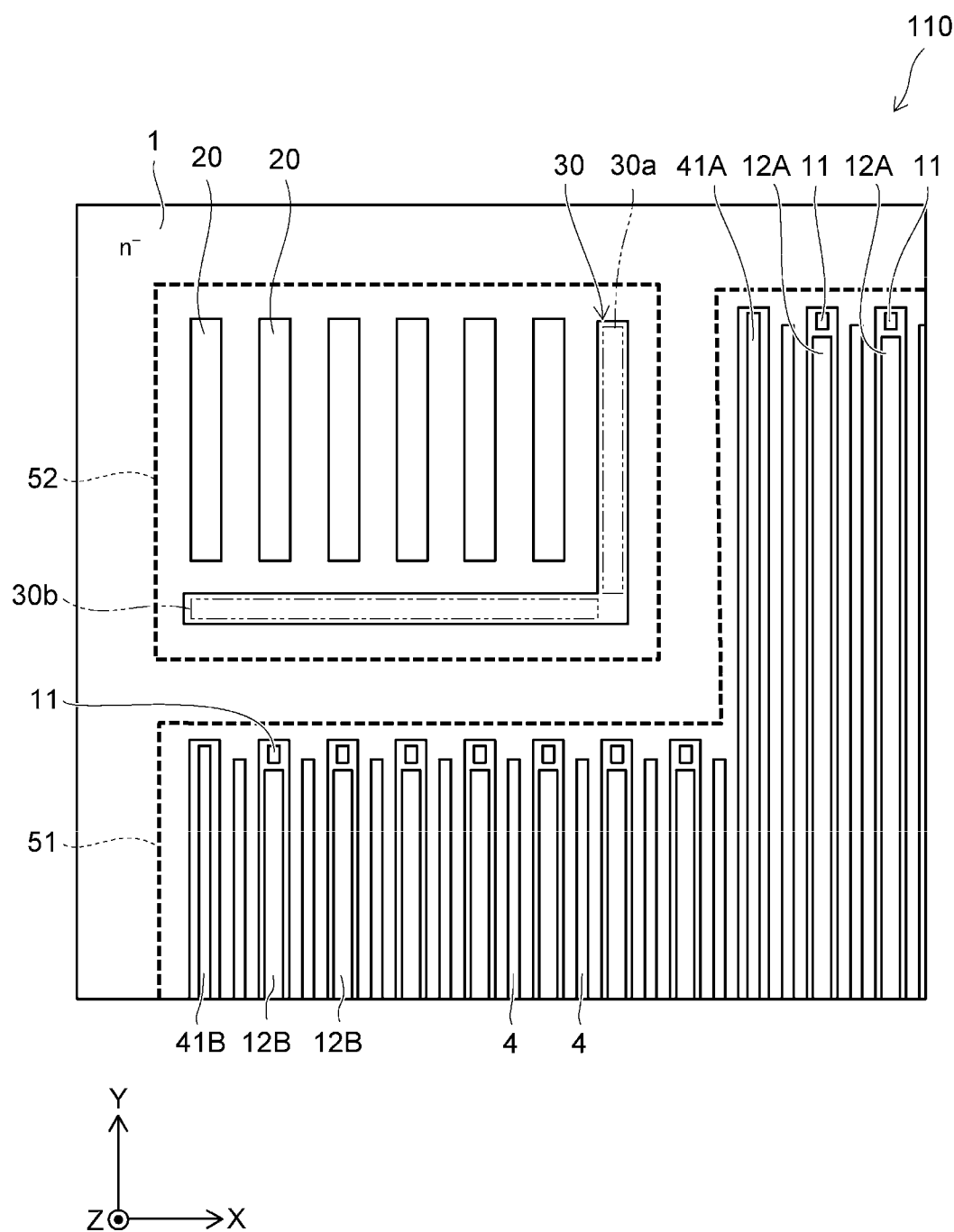
FIG. 10 is a plan view illustrating a part of a semiconductor device according to a first modification example of some embodiments.

FIG. 10 is a plan view illustrating a portion of a semiconductor device 110 according to a first modification example of the embodiments illustrated in FIGS. 1 to 5.

In FIG. 10, a source electrode 51 and a gate pad 52 are indicated by broken lines, and an insulating layer 45 and each semiconductor region are omitted.

In the semiconductor device 100 illustrated in FIGS. 2 to 4, the gate electrode 12 extends in the Y direction and the insulating unit 20 extends in the X direction. In contrast, in the semiconductor device 110 according to the modification example, both the gate electrode 12 and the insulating unit 20 extend in the Y direction (see FIG. 10).

In the semiconductor device 110, similar to the semiconductor device 100, a plurality of insulating units 20 are provided below a gate pad 52. In addition, in some embodiments, a second insulating portion 30b of an insulating unit 30 is provided between the plurality of gate electrodes 12B and the plurality of insulating units 20 in the Y direction.

Therefore, according to the modification example, similar to the semiconductor device 100, it is possible to reduce an amount of the positive holes accumulated during the diode operation and an amount of the positive holes discharged during the reverse recovery operation.

In addition, the modification example is the same as the embodiments illustrated in FIGS. 1 to 5 in that the insulating unit 30 further includes a first insulating portion 30a extending in the Y direction and thereby the positive holes flowing through the gap between the insulating unit 20 and the second insulating portion 30b can be reduced.

However, if the gate electrode 12 and the insulating unit 20 extend in directions different from each other, flowing of the positive holes accumulated between the insulating units 20 may be inhibited from moving by the gate electrode 12 when the positive holes flow toward the source electrode 51 along the insulating unit 20. Therefore, if the gate electrode 12 and the insulating unit 20 extend in directions different from each other, it is possible to further reduce a possibility that the charge Qrr (see FIG. 8) is reduced and the parasitic NPN transistor is operated, compared to a case where the gate electrode 12 and the insulating unit 20 extend in the same direction.

Second Modification Example

Figure 11:
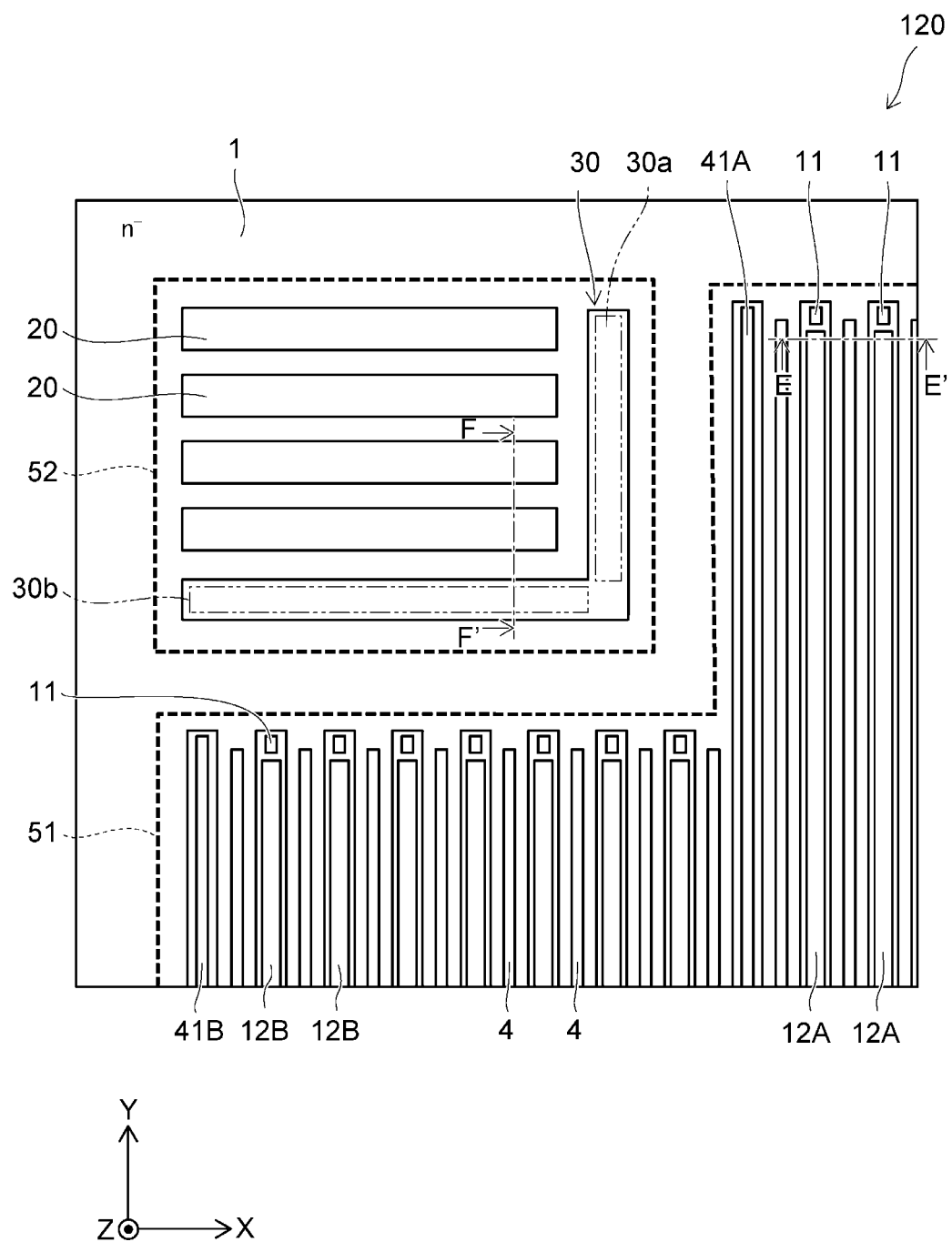
FIG. 11 is a plan view illustrating a part of a semiconductor device according to a second modification example of some embodiments.

FIG. 11 is a plan view illustrating a portion of a semiconductor device 120 according to a second modification example of the embodiments illustrated in FIGS. 1 to 5.

FIG. 12A is a sectional view that is taken along line E-E' in FIG. 11 and FIG. 12B is a sectional view that is taken along line F-F' in FIG. 11.

FIGS. 13A and 13B are partially enlarged sectional views illustrating another example of the semiconductor device 120 according to the second modification example.

Moreover, in FIG. 11, a source electrode 51 and a gate pad 52 are indicated by broken lines, and an insulating layer 45 and each semiconductor region are omitted.

In the semiconductor device 120 according to the modification example, as illustrated in FIG. 11, a gate electrode 12 and an insulating unit 20 extend in directions different from each other. In addition, as illustrated in FIGS. 12A and 12B, in some embodiments, a width W2 of the insulating unit 20 and a width W3 of the insulating unit 30 are wider than a width W1 of the insulating unit 10.

Here, the width is defined as a length of each insulating unit in a direction perpendicular to a direction in which each insulating unit extends.

In some embodiments, a distance D2 between the insulating units 20 and a distance D3 between the insulating units 20 and 30 are shorter than a distance D1 between the insulating units 10. In some embodiments, a lower end of the insulating unit 20 and a lower end of the insulating unit 30 are provided lower than a lower end of the insulating unit 10.

In some embodiments, the width W2 and the width W3 are wider than the width W1, and the distance D2 and the distance D3 are shorter than the distance D1. Therefore, a volume of the n$^-$-type semiconductor region 1 below the gate pad 52 can be reduced and it is possible to reduce an amount of the positive holes accumulated below the gate pad 52 compared to the semiconductor device 100.

In some embodiments, the lower end of the insulating unit 20 and the lower end of the insulating unit 30 are provided lower than the lower end of the insulating unit (see FIGS. 12A and 12B). Therefore, the volume of the n$^-$-type semiconductor region 1 below the gate pad 52 can be further reduced and it is possible to reduce the charge Qrr indicated in FIG. 8. In addition, since a time until the positive holes accumulated between the insulating units 20 are discharged from the source electrode 51 can be further increased, it is possible to further reduce the dir/dt (see FIG. 8).

That is, according to the semiconductor device 120 according to the modification example, it is possible to further reduce a possibility that the parasitic NPN transistor is operated compared to the semiconductor device 100.

Moreover, as illustrated in FIGS. 13A and 13B, in some embodiments, the width W3 of the insulating unit 30 is wider than the width W2 and the distance D3 is shorter than the distance D2. In some embodiments, a position of the lower end of the insulating unit 30 is deeper than a position of the lower end of the insulating unit 20. Therefore, an amount of the positive holes accumulated below the gate pad 52 and an amount of the positive holes discharged to the source electrode 51 can be reduced and it is possible to reduce a possibility that the parasitic NPN transistor is operated.

Third Modification Example

Figure 14:
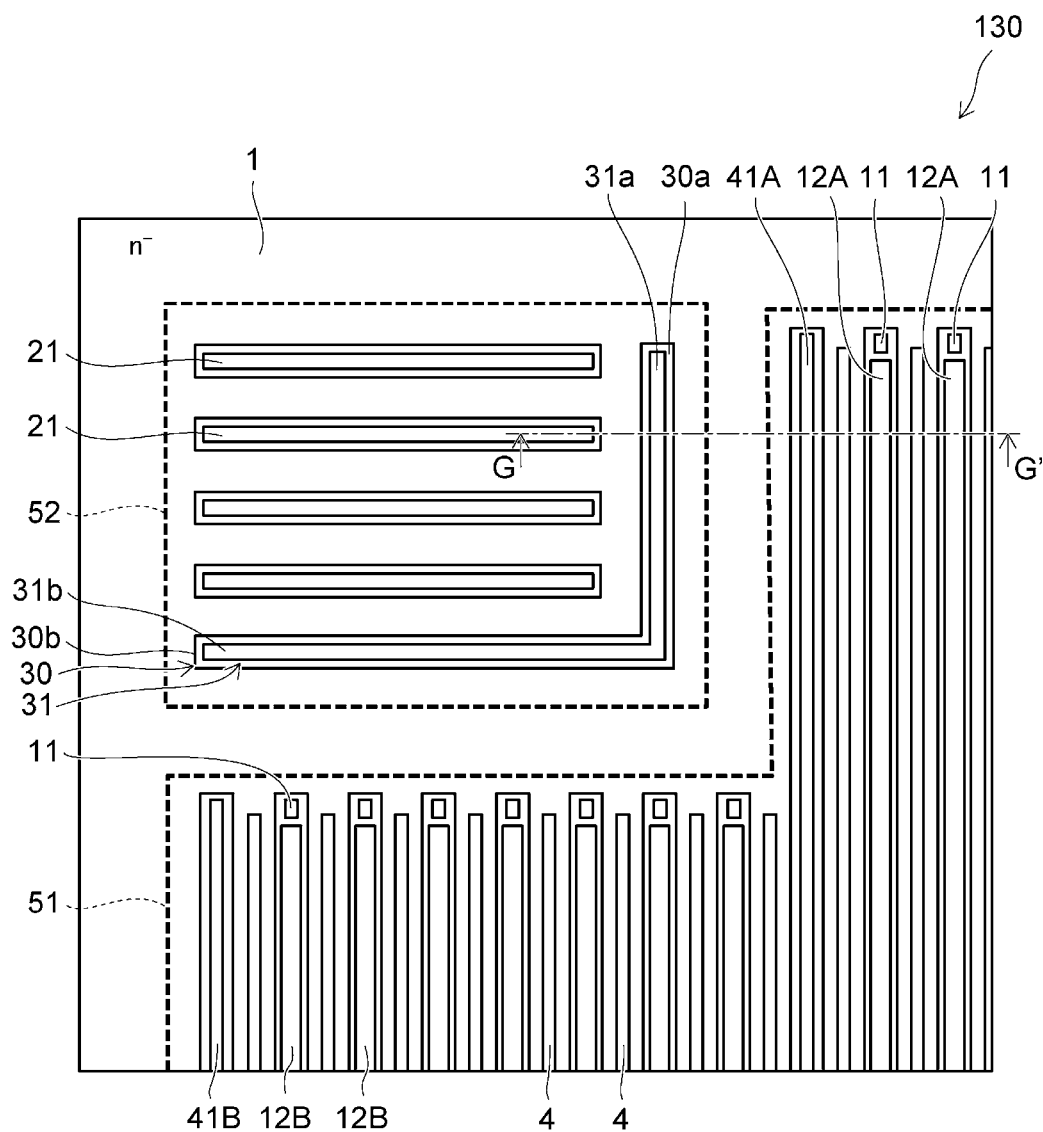
FIG. 14 is a plan view illustrating a part of a semiconductor device according to a third modification example of some embodiments.

FIG. 14 is a plan view illustrating a portion of a semiconductor device 130 according to a third modification example of the embodiments illustrated in FIGS. 1 to 5.

Figure 15:
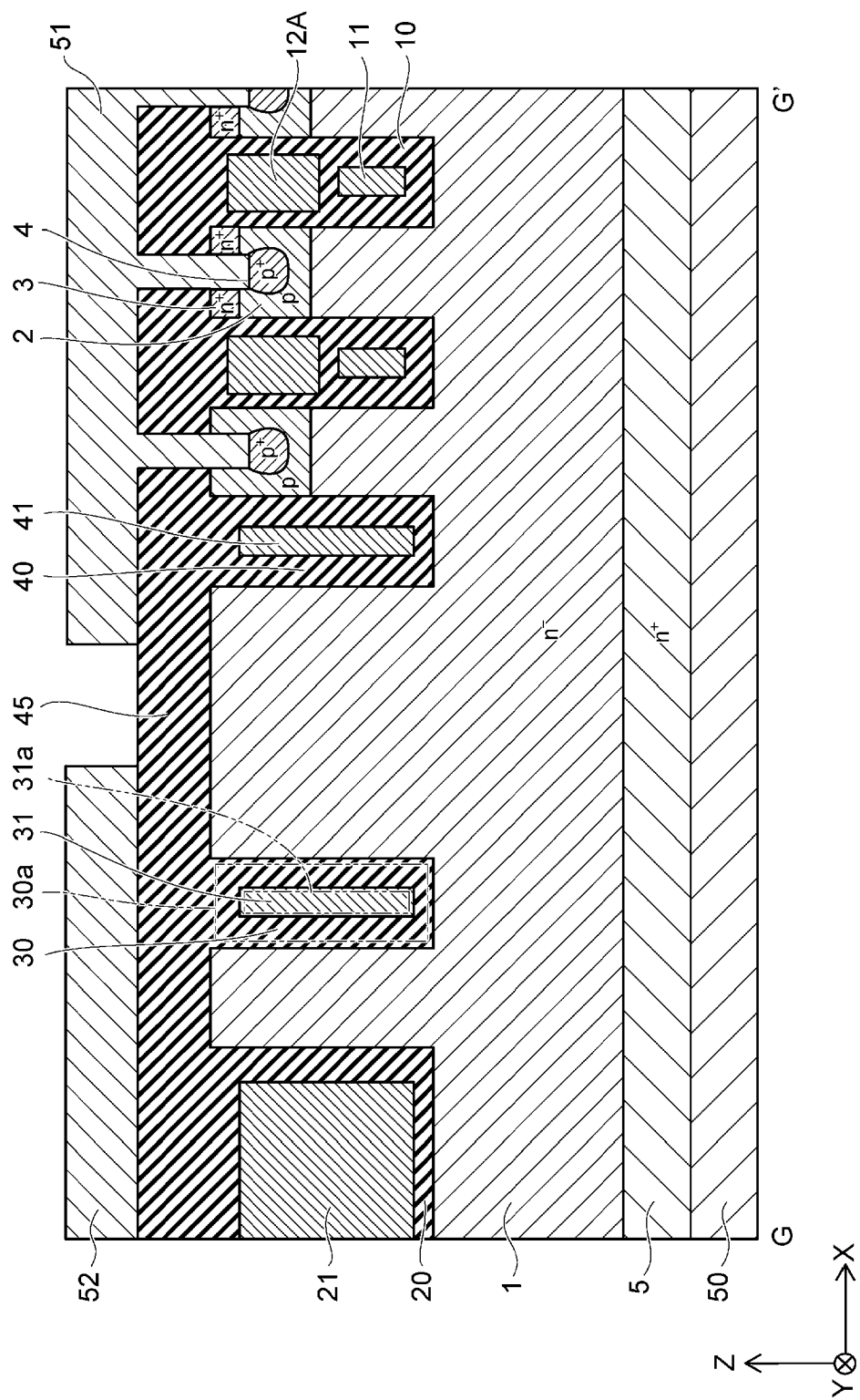
FIG. 15 is a sectional view that is taken along line G-G' in FIG. 14.

FIG. 15 is a sectional view that is taken along line G-G' in FIG. 14.

Moreover, in FIG. 14, a source electrode 51 and a gate pad 52 are indicated by broken lines, and an insulating layer 45 and each semiconductor region are omitted.

The semiconductor device 130 is different from the semiconductor device 100 (see FIG. 9) in that a conductive units 21 and a conductive unit 31 are further included. In some embodiments, the conductive units 21 are provided in the insulating unit 20 (see FIG. 15) and the conductive unit 31 is provided in the insulating unit 30.

In some embodiments, the conductive units 21 extend in the X direction along the insulating unit 20 (see FIG. 15).

The conductive unit 31 includes a first conductive portion 31a and a second conductive portion 31b. The first conductive portion 31a is provided in the first insulating portion 30a and extends in the Y direction. The second conductive portion 31b is provided in the second insulating portion 30b and extends in the X direction.

In some embodiments, the conductive units 21 and 31 are electrically isolated from the source electrode 51 and the gate pad 52, and potentials of these conductive units are in a floating state.

Also in the semiconductor device 130 according to the modification example, similar to the semiconductor device 100, the charge Qrr and the dir/dt (see FIG. 8) can be reduced, and it is possible to reduce a possibility that the parasitic NPN transistor is operated.

In some embodiments, the conductive units 21 and 31 are electrically isolated from the source electrode 51 and the gate pad 52. Therefore, increases in a capacitance of the source electrode 51 and a capacitance of the gate pad 52 can be suppressed and it is possible to suppress a decrease in a switching speed of the semiconductor device.

Moreover, here, although the conductive units 21 and 31 are provided with respect to the semiconductor device 100, the modification example is not limited to the case. For example, the conductive units 21 and 31 may be provided in the insulating unit 20 and the insulating unit 30 of the semiconductor device 110 or 120.

Figure 16:
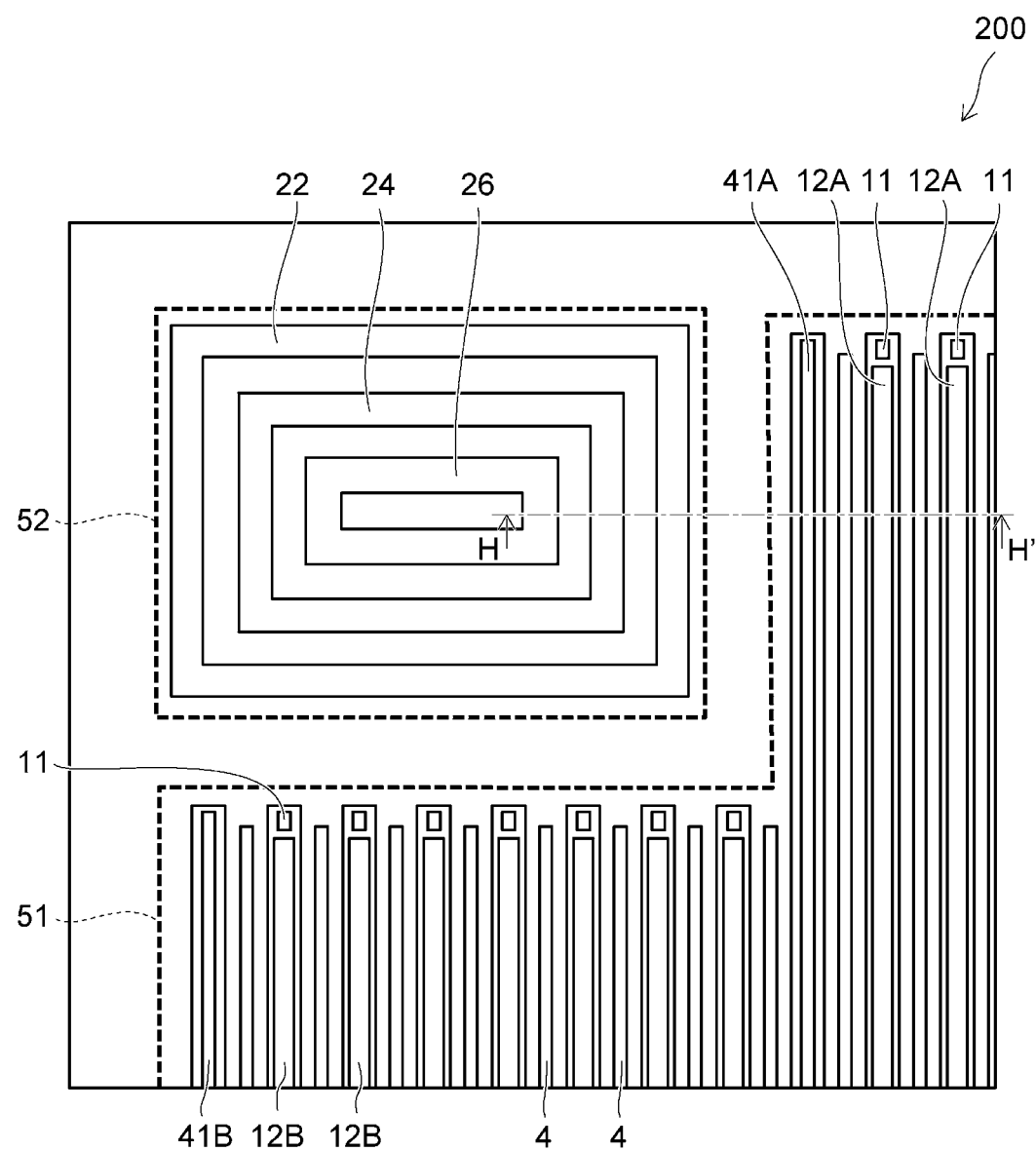
FIG. 16 is a plan view illustrating a part of a semiconductor device according to some embodiments.

FIG. 16 is a plan view illustrating a portion of a semiconductor device 200 according to some embodiments.

Figure 17:
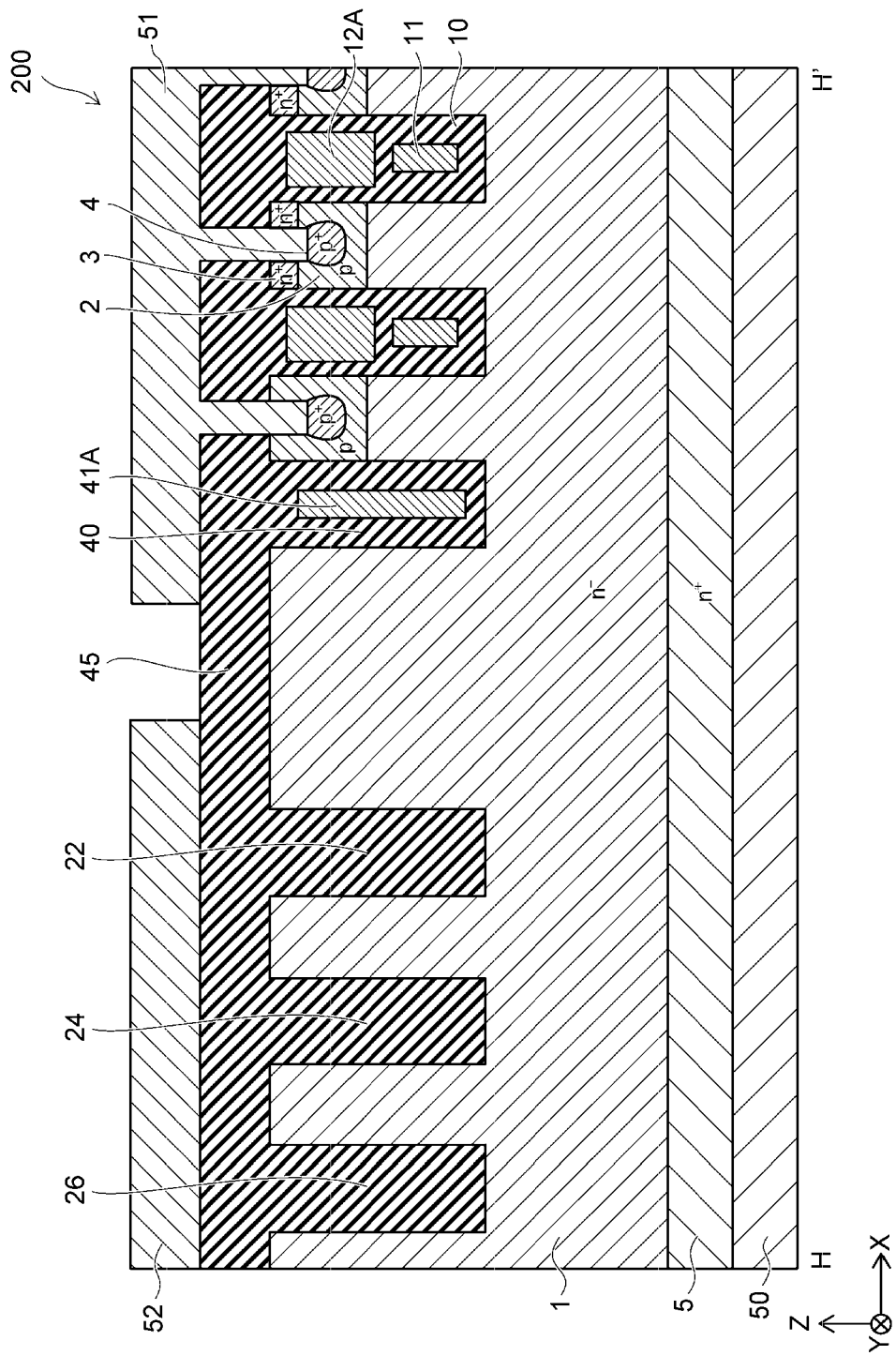
FIG. 17 is a sectional view that is taken along line H-H' in FIG. 16.

FIG. 17 is a sectional view that is taken along line H-H' in FIG. 16.

Moreover, in FIG. 16, a source electrode 51 and a gate pad 52 are indicated by broken lines and an insulating layer 45 and each semiconductor region are omitted.

The semiconductor device 200 is different from the semiconductor device 100 (see FIG. 9) in a configuration of an insulating unit provided below the gate pad 52.

In some embodiments, as illustrated in FIGS. 16 and 17, in the semiconductor device 200, insulating units 22 (e.g., as a second insulating unit), 24 (e.g., as a third insulating unit), and 26 are provided below the gate pad 52. The insulating units 22, 24, and 26 are respectively annularly provided, and surround a portion of an $n^-$-type semiconductor region 1. The insulating unit 24 is provided on an inside of the insulating unit 22 and the insulating unit 26 is provided on an inside of the insulating unit 24.

If a plurality of insulating units extending in a predetermined direction are provided below the gate pad 52, the positive holes may move between a region below the gate pad 52 and the source electrode 51 via a gap between the insulating units.

In contrast, as in the semiconductor device 200 according to some embodiments, it is possible to further suppress the movement of the positive holes between the region below the gate pad 52 and the source electrode 51 by providing the annular insulating units below the gate pad 52. Therefore, according to some embodiments, the dir/dt indicated in FIG. 8 can be further reduced and it is possible to further reduce a possibility that the parasitic NPN transistor is operated, as compared to the semiconductor device according to the embodiments illustrated in FIGS. 1 to 5.

Moreover, in some embodiments, the number of the annular insulating units provided below the gate pad 52 may be less than that of the example indicated in FIG. 16 or may be greater than that thereof. That is, the number of the insulating units may be appropriately changed.

First Modification Example

Figure 18:
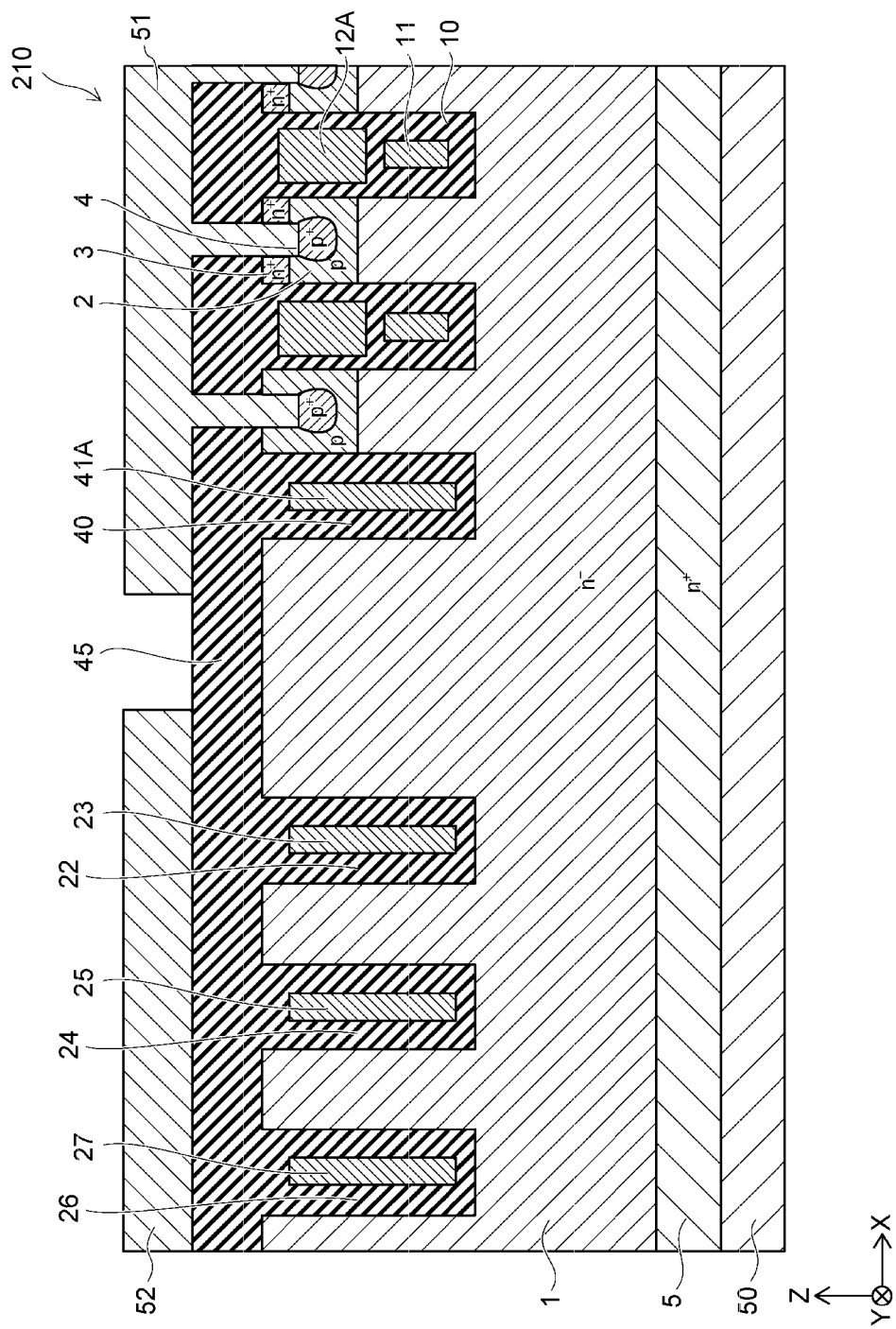
FIG. 18 is a sectional view illustrating a part of a semiconductor device according to a first modification example of some embodiments.

FIG. 18 is a sectional view illustrating a portion of a semiconductor device 210 according to a first modification example of the embodiments illustrated in FIGS. 16 and 17.

The semiconductor device 210 is different from the semiconductor device 200 (see FIGS. 16 and 17) in that conductive units 23, 25, and 27 are further included.

As illustrated in FIG. 18, in some embodiments, the conductive units 23, 25, and 27 are respectively provided in insulating units 22, 24, and 26. The conductive units 23, 25, and 27 are respectively annularly provided (e.g., in the annular insulating units 22, 24 and 26 as illustrated in FIG. 16) and surround a portion of an $n^-$-type semiconductor region 1.

In some embodiments, the conductive units 23, 25, and 27 are electrically isolated from the source electrode 51 and the gate pad 52, and potentials of these conductive units are in a floating state.

Also in the modification example, similar to the semiconductor device 200, the charge Qrr and the dir/dt (see FIG. 8) can be reduced, and it is possible to reduce a possibility that the parasitic NPN transistor is operated.

In some embodiments, the conductive units 23, 25, and 27 are electrically isolated from the source electrode 51 and the gate pad 52. Therefore, increases in a capacitance of the source electrode 51 and a capacitance of the gate pad 52 can be suppressed, and it is possible to suppress a decrease in a switching speed of the semiconductor device.

Second Modification Example

Figure 19:
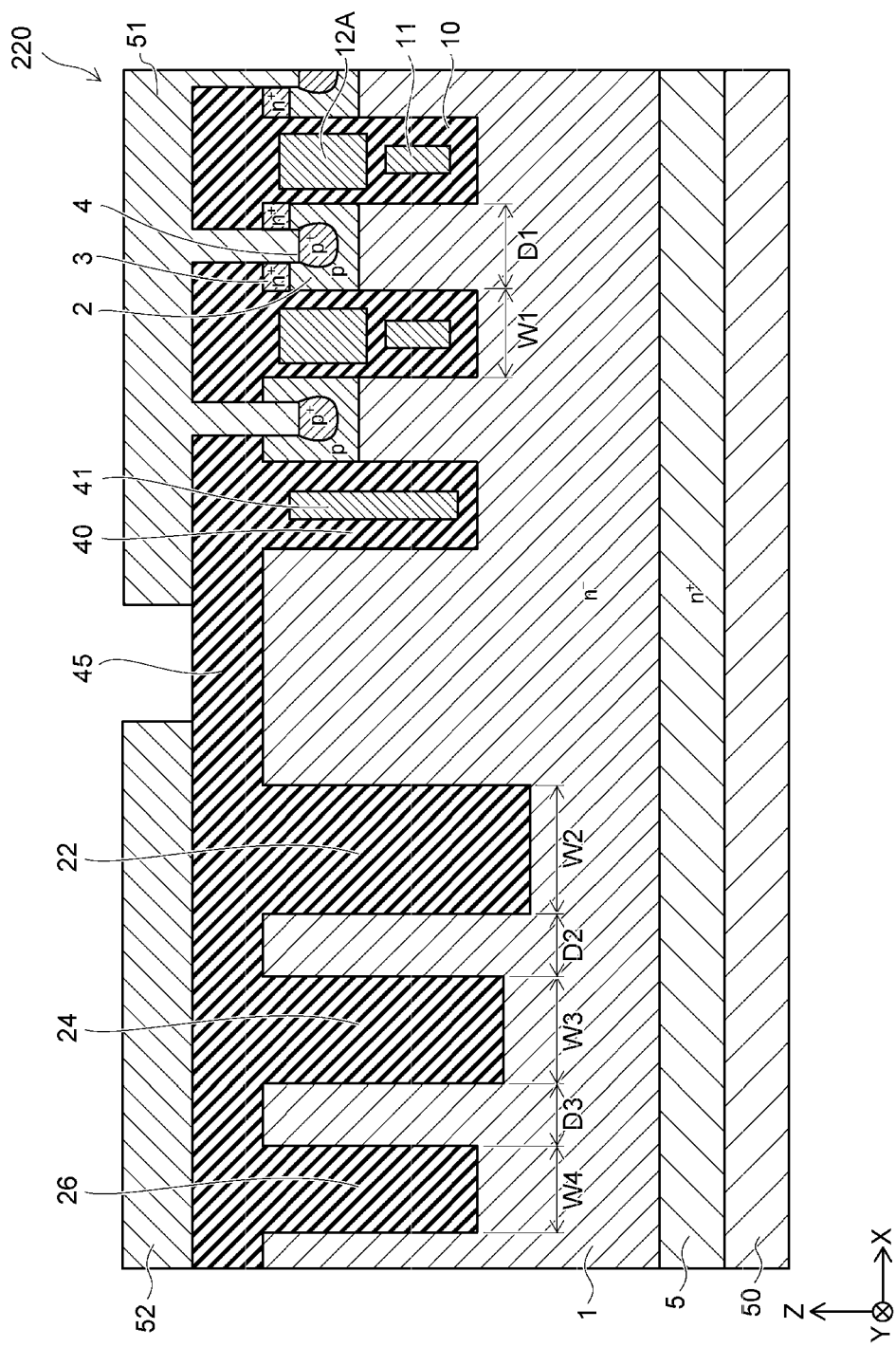
FIG. 19 is a sectional view illustrating a part of a semiconductor device according to a second modification example of some embodiments.

FIG. 19 is a sectional view illustrating a portion of a semiconductor device 220 according to a second modification example of the embodiments illustrated in FIGS. 16 and 17.

The semiconductor device 220 is different from the semiconductor device 200 (see FIGS. 16 and 17) in a configuration of insulating units 22, 24, and 26.

As illustrated in FIG. 19, in some embodiments, a width W2 of the insulating unit 22 is wider than a width W3 of the insulating unit 24, and a width W3 is wider than a width W4 of the insulating unit 26. The width W2 is, for example, the same as the width of the insulating unit 10 or may be wider than that of the insulating unit 10.

In some embodiments, a distance D2 between the insulating units 22 and 24 can be narrower than a distance D3 between the insulating units 24 and 26. The distance D3 is narrower than the distance D1 between the insulating units 10. In some embodiments, a position of a lower end of the insulating unit 22 is deeper than a position of a lower end of the insulating unit 24, and the position of the lower end of the insulating unit 24 is deeper than a position of a lower end of the insulating unit 26. The position of the lower end of the insulating unit 26 is, for example, the same as the position of the lower end of the insulating unit 10, or deeper than the position of the lower end of the insulating unit 10.

That is, the insulating units 22, 24, and 26 are wider in width and deeper in the position of the lower end as going outward (e.g., as compared with the insulating unit 10). The width of the insulating unit on the outside is wide and the position of the lower end thereof is deep (e.g., as compared with the insulating unit 10). Therefore, as compared to the semiconductor device 200 (see FIGS. 16 and 17), the movement of the positive holes between the region below the gate pad 52 and the source electrode 51 can be further suppressed, and the dir/dt can be reduced. Therefore, according to the modification example, it is possible to further reduce a possibility that the parasitic NPN transistor is operated.

Moreover, in some embodiments, in the semiconductor device 220, similar to the semiconductor device 210 (see FIG. 18), the conductive units 23, 25, and 27 may be respectively provided in the insulating units 22, 24, and 26.

In each embodiment described above, a relative magnitude of the impurity concentration between the semiconductor regions respectively can be confirmed by, for example, a scanning type capacitance microscope (SCM). Moreover, the carrier concentration in each semiconductor region can be regarded as equal to the impurity concentration activated in each semiconductor region. Therefore, even a relative magnitude of the carrier concentration between the semiconductor regions respectively can be also confirmed by the SCM.

In some embodiments, the impurity concentration of each semiconductor region can be measured, for example, by a secondary ion mass spectrometry (SIMS).

While certain embodiments have been described, these embodiments have been presented by way of example only, and are not intended to limit the scope of the inventive concept. Indeed, the embodiments described herein may be embodied in a variety of other forms; furthermore, various omissions, substitutions and changes in the form of the embodiments described herein may be made without departing from the spirit of the inventive concept. The accompanying claims and their equivalents are intended to cover such forms or modifications as would fall within the scope and spirit of the inventive concept. For example, a specific configuration of each element such as the $n^-$-type semiconductor region 1, the p-type base region 2, the $n^+$-type source region 3, the $p^+$-type contact region 4, the $n^+$-type drain region 5, the insulating unit 10, the field plate electrode 11, the gate electrode 12, the insulating units 20, 22, 24, and 26, the conductive units 21, 23, 25, and 27, the insulating unit 30, the conductive unit 31, the insulating unit 40, the field plate electrode 41, the insulating layer 45, the drain electrode 50, the source electrode 51, or the gate pad 52 can be appropriately selected from technique known to those skilled in the art. These embodiments and the modifications thereof are included in the scope and gist of the exemplary embodiment and are included in the exemplary embodiment described in the claims and their equivalent scope. In addition, each embodiment described above can be implemented in combination with each other.

What is claimed is:

1. A semiconductor device comprising:
   a first semiconductor region of a first conductivity type;
   a second semiconductor region of a second conductivity type that is selectively provided on the first semiconductor region;
   a third semiconductor region of the first conductivity type that is selectively provided on the second semiconductor region;
   gate electrodes that are provided in the first semiconductor region and the second semiconductor region via a first insulating unit and extend in a first direction;
   a first electrode that is provided on the third semiconductor region and is electrically connected to the third semiconductor region;
   a second insulating unit that is spaced apart from the gate electrodes in the first semiconductor region and having in plan view a long axis extending in a second direction intersecting the first direction;
   a third insulating unit which includes a first insulating portion having in plan view a long axis extending in the first direction, in which the first insulating portion is positioned between the gate electrodes and the second insulating unit in the second direction and is spaced apart from the gate electrodes and the second insulating unit in the first semiconductor region, without the second insulating unit surrounding the third insulating unit; and
   a second electrode that is provided on the second insulating unit and the third insulating unit, and is electrically connected to the gate electrodes.

2. The device according to claim 1,
   wherein a plurality of the gate electrodes are provided in the second direction,
   wherein a plurality of the second insulating units are provided in the first direction, and
   wherein the first insulating portion is positioned between the plurality of gate electrodes and the plurality of second insulating units in the second direction.

3. The device according to claim 1,
   wherein a plurality of the gate electrodes are provided in the second direction,
   wherein a plurality of the second insulating units are provided in the first direction,
   wherein the third insulating unit further includes a second insulating portion extending in the second direction,
   wherein the first insulating portion is positioned between a portion of the plurality of gate electrodes and the plurality of second insulating units in the second direction, and
   wherein the second insulating portion is positioned between another portion of the plurality of gate electrodes and the plurality of second insulating units in the first direction.

4. The device according to claim 1, further comprising:
a first conductive unit that is provided in the second insulating unit, and
a second conductive unit that is provided in the third insulating unit,
wherein the first conductive unit extends in the second direction,
wherein the second conductive unit includes a first conductive portion extending in the first direction in the first insulating portion, and
wherein the first conductive unit and the second conductive unit are electrically isolated from the first electrode and the second electrode.

\* \* \* \* \*